US011776481B2

(12) United States Patent
Li et al.

(10) Patent No.: US 11,776,481 B2
(45) Date of Patent: Oct. 3, 2023

(54) DISPLAY SUBSTRATE AND MANUFACTURE METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Wenqiang Li, Beijing (CN); Ke Liu, Beijing (CN); Ling Shi, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 148 days.

(21) Appl. No.: 17/433,107

(22) PCT Filed: Apr. 30, 2020

(86) PCT No.: PCT/CN2020/087974
§ 371 (c)(1),
(2) Date: Aug. 23, 2021

(87) PCT Pub. No.: WO2021/217546
PCT Pub. Date: Nov. 4, 2021

(65) Prior Publication Data
US 2022/0343854 A1    Oct. 27, 2022

(51) Int. Cl.
*G09G 3/3266* (2016.01)
*G11C 19/28* (2006.01)

(52) U.S. Cl.
CPC .......... *G09G 3/3266* (2013.01); *G11C 19/28* (2013.01); *G09G 2300/0426* (2013.01); *G09G 2310/0286* (2013.01)

(58) Field of Classification Search
CPC ......... G09G 3/3266; G09G 2310/0286; G09G 2300/0426; G11C 19/28; H01L 27/124; H01L 27/1222; H01L 27/1244
See application file for complete search history.

(56) References Cited

U.S. PATENT DOCUMENTS

| 2021/0217341 A1 | 7/2021 | Huang et al. |
| 2022/0302240 A1 | 9/2022 | Zhang et al. |

FOREIGN PATENT DOCUMENTS

| CN | 108182921 A | 6/2018 |
| CN | 109375832 A | 2/2019 |

(Continued)

OTHER PUBLICATIONS

Extended European Search Report dated Apr. 28, 2023 received in European Patent Application No. EP 20933225.3.

*Primary Examiner* — Xuemei Zheng
(74) *Attorney, Agent, or Firm* — Scully, Scott, Murphy & Presser, P.C.

(57) ABSTRACT

A display substrate and a manufacture method, and a display device are provided. The display substrate includes a shift register unit, a first clock signal line, and a second clock signal line. The shift register unit includes an input circuit, an output circuit, a first control circuit, a second control circuit, and a voltage stabilizing circuit. A first electrode of the first noise reduction transistor of the second control circuit and a first electrode of the voltage stabilizing transistor of the voltage stabilizing circuit are in a first source-drain electrode layer, which includes a first transfer electrode, which includes a first portion and a second portion, the first portion is connected to the first electrode of the first noise reduction transistor and the first electrode of the voltage stabilizing transistor, and the second portion is connected to the gate electrode of the first control transistor of the first control circuit.

20 Claims, 7 Drawing Sheets

(56) References Cited

FOREIGN PATENT DOCUMENTS

| | | | |
|---|---|---|---|
| CN | 109712551 | A | 5/2019 |
| CN | 110416226 | A | 11/2019 |
| CN | 110767665 | A | 2/2020 |
| EP | 3644302 | A2 | 4/2020 |
| KR | 20140131137 | A | 11/2014 |

DISPLAY SUBSTRATE AND MANUFACTURE METHOD THEREOF, AND DISPLAY DEVICE

CROSS-REFERENCE TO RELATED APPLICATION

This application is a national phase entry of PCT International Application No. PCT/CN2020/087974, filed on Apr. 30, 2020. The disclosure of PCT International Application No. PCT/CN2020/087974 is incorporated by reference herein.

TECHNICAL FIELD

The embodiments of the present disclosure relate to a display substrate and a manufacture method thereof, and a display device.

BACKGROUND

Display devices have developed rapidly in recent years, in particular, AMOLED (active-matrix organic light-emitting diode) display devices have attracted people's attention because of their advantages, such as bright in color, good viewing angle, high contrast, fast response speed, and low power consumption. The AMOLED display devices have a broad application space in a plurality of display fields, such as mobile display, vehicle display, and medical display, while a flexible AMOLED display device is mainly used in the field of deformable screen display. With the gradual development of technology and the renewal of people's demand for display devices, the shape design of the screen faces more new challenges.

SUMMARY

At least one embodiment of the present disclosure provides a display substrate, comprising: a base substrate, comprising a display region and a peripheral region on at least one side of the display region; and a shift register unit, a first clock signal line, and a second clock signal line, which are on the peripheral region of the base substrate; the first clock signal line and the second clock signal line extend along a first direction on the base substrate, and are configured to respectively provide a first clock signal and a second clock signal to the shift register unit; the shift register unit comprises an input circuit, an output circuit, a first control circuit, a second control circuit, and a voltage stabilizing circuit; the input circuit is configured to input an input signal to a first node in response to the first clock signal; the first control circuit is connected to the first node and a second node, and is configured to control a level of the second node in response to a level of the first node and the first clock signal; the second control circuit is connected to the first node and the second node, and is configured to control the level of the first node under control of the level of the second node and the second clock signal; the voltage stabilizing circuit is connected to the first node and a third node, and is configured to stabilize a level of the third node; and the output circuit is connected to the third node, and is configured to output an output signal to an output terminal under control of the level of the third node, the first control circuit comprises a first control transistor, the second control circuit comprises a first noise reduction transistor, the voltage stabilizing circuit comprises a voltage stabilizing transistor, a gate electrode of the first control transistor, a first electrode of the first noise reduction transistor, and a first electrode of the voltage stabilizing transistor are all connected to the first node; the first electrode of the first noise reduction transistor and the first electrode of the voltage stabilizing transistor are in a first source-drain electrode layer, and the first source-drain electrode layer comprises a first transfer electrode; and the first transfer electrode comprises a first portion extending in parallel along a second direction different from the first direction and a second portion integrally formed with the first portion and extending along the first direction, a first end of the first portion is connected to the first electrode of the first noise reduction transistor, a second end of the first portion is connected to the first electrode of the voltage stabilizing transistor, and the second portion is connected to the gate electrode of the first control transistor that is not in a same layer as the second portion.

For example, in the display substrate provided by at least one embodiment of the present disclosure, the first transfer electrode further comprises a third portion extending in parallel along the second direction, the third portion is connected to the second portion, and the third portion and the first portion are arranged side by side in the first direction; the input circuit comprises an input transistor, and an orthographic projection of an active layer of the input transistor on the base substrate is between an orthographic projection of an active layer of the first control transistor on the base substrate and an orthographic projection of an active layer of the first noise reduction transistor on the base substrate; and a first electrode of the input transistor is connected to an end of the third portion.

For example, in the display substrate provided by at least one embodiment of the present disclosure, the first transfer electrode comprises the first node.

For example, the display substrate provided by at least one embodiment of the present disclosure, further comprises a second transfer electrode, the first control circuit further comprising a second control transistor, the second transfer electrode comprises a first portion and a second portion parallel to the second direction, and an end of the first portion of the second transfer electrode is connected to a first electrode of the second control transistor, and the second portion of the second transfer electrode is connected to a first electrode of the first control transistor; and the second transfer electrode comprises the second node.

For example, in the display substrate provided by at least one embodiment of the present disclosure, an orthographic projection of an active layer of the second control transistor on the base substrate is on a side of an orthographic projection of an active layer of the first control transistor on the base substrate away from the display region.

For example, in the display substrate provided by at least one embodiment of the present disclosure, the second control circuit further comprises a second noise reduction transistor; an active layer of the second noise reduction transistor and an active layer of the first noise reduction transistor are in a first semiconductor layer that is continuous, and the first semiconductor layer extends along the first direction, a gate electrode of the second noise reduction transistor and a gate electrode of the first noise reduction transistor extend along the second direction and are arranged side by side along the first direction; the display substrate further comprises a first connection wiring line and a second connection wiring line extending along the second direction, the first connection wiring line and the second connection wiring line are arranged in parallel, and the first connection wiring line and the second connection wiring line overlap the first transfer electrode, respectively; a first end of the first connection wiring line is connected to the gate electrode of the second noise reduction transistor, and a second end of the first connection wiring line is connected to an end of the second portion of the second transfer electrode that is not in a same layer as the first connection wiring line; and a first end of the second connection wiring line is connected to the gate electrode of the first noise reduction transistor, and a second end of the second connection wiring line is connected to the second clock signal line to receive the second clock signal.

For example, in the display substrate provided by at least one embodiment of the present disclosure, an orthographic projection of the active layer of the second noise reduction transistor and an orthographic projection of the active layer of the first noise reduction transistor on the base substrate are at a side of an orthographic projection of an active layer of the first control transistor on the base substrate close to the display region.

For example, in the display substrate provided by at least one embodiment of the present disclosure, the shift register unit further comprises a first insulation layer, a second insulation layer, and a third insulation layer; the first insulation layer is between the active layer of the first control transistor and the gate electrode of the first control transistor, and the second insulation layer and the third insulation layer are between the first transfer transistor and the gate electrode of the first control transistor; the gate electrode of the first control transistor is connected to the second portion of the first transfer electrode through a hole penetrating through the second insulation layer and the third insulation layer; and the second end of the first connection wiring line is connected to the end of the second portion of the second transfer electrode through a hole penetrating through the second insulation layer and the third insulation layer.

For example, in the display substrate provided by at least one embodiment of the present disclosure, an orthographic projection of an active layer of the voltage stabilizing transistor on the base substrate is on a side of an orthographic projection of an active layer of the first control transistor on the base substrate away from the display region.

For example, in the display substrate provided by at least one embodiment of the present disclosure, an included angle between the first direction and the second direction is between 70° and 90°.

For example, in the display substrate provided by at least one embodiment of the present disclosure, the first clock signal line and the second clock signal line are on a side of the shift register unit away from the display region.

For example, the display substrate provided by at least one embodiment of the present disclosure further comprises a first power line configured to provide a first voltage to the shift register unit, the first power line extends along the first direction on the base substrate and is connected to the second control circuit; and an orthographic projection of the first power line on the base substrate is on a side of an orthographic projection of the shift register unit on the base substrate close to the display region.

For example, the display substrate provided by at least one embodiment of the present disclosure, further comprises a second power line, the second power line extends along the first direction on the base substrate and is configured to provide a second voltage to the shift register unit; an orthographic projection of the second power line on the base substrate is between orthographic projections of the first clock signal line as well the second clock signal line on the base substrate and an orthographic projections of the shift register unit on the base substrate; and a gate electrode of the voltage stabilizing transistor is connected to the second power line to receive the second voltage.

For example, in the display substrate provided by at least one embodiment of the present disclosure, the second power line comprises a protrusion portion protruding in the second direction, and a second electrode of the second control transistor is connected to the protrusion portion on the second power line to receive the second voltage.

For example, in the display substrate provided by at least one embodiment of the present disclosure, the input transistor comprises a first gate electrode and a second gate electrode arranged in parallel; the first gate electrode and the second gate electrode of the input transistor are connected to a gate electrode of the second control transistor; and the gate electrode of the second control transistor is also connected to the first clock signal line, and the first clock signal line provides the first clock signal to the gate electrode of the second control transistor and the first gate electrode and the second gate electrode of the input transistor.

For example, the display substrate provided by at least one embodiment of the present disclosure, further comprises a third transfer electrode, and the third transfer electrode extending along the first direction, a first end of the third transfer electrode is connected to the gate electrode of the second control transistor and the first gate electrode and the second gate electrode of the input transistor through a hole penetrating through an insulation layer, and a second end of the third transfer electrode is connected to a second electrode of the first control transistor.

For example, in the display substrate provided by at least one embodiment of the present disclosure, the shift register unit further comprises an output control circuit; the output control circuit is configured to control a level of the output terminal under control of the level of the second node; the output control circuit comprises an output control transistor and a first capacitor; and an orthographic projection of the first capacitor on the base substrate is on a side of an orthographic projection of an active layer of the output control transistor on the base substrate close to the display region, and the orthographic projection of the first capacitor on the base substrate and the orthographic projection of the first power line on the base substrate at least partially overlap.

For example, in the display substrate provided by at least one embodiment of the present disclosure, a shape of the first capacitor is a rectangle.

For example, the display substrate provided by at least one embodiment of the present disclosure, further comprising a fourth transfer electrode, the fourth transfer electrode is connected to a first electrode of the second noise reduction transistor and a first electrode of the output control transistor; a gate electrode of the second noise reduction transistor is connected to a gate electrode of the output control transistor; and the fourth transfer electrode also comprises the second node.

For example, the display substrate provided by at least one embodiment of the present disclosure, further comprises a fifth transfer electrode, the output circuit comprises an output transistor and a second capacitor, an orthographic projection of the second capacitor on the base substrate is on a side of the orthographic projection of the first power line on the base substrate away from the display region; and a first electrode of the output transistor is connected to a first end of the fifth transfer electrode, and a gate electrode of the first noise reduction transistor is connected to the fifth transfer electrode through a hole penetrating through an insulation layer.

For example, in the display substrate provided by at least one embodiment of the present disclosure, the second capacitor is rectangular.

For example, the display substrate provided by at least one embodiment of the present disclosure, further comprises a sixth transfer electrode extending along the second direction, a gate electrode of the output transistor is connected to a first end of the sixth transfer electrode through a hole penetrating through the insulation layer, and a second end of the sixth transfer electrode is connected to a second electrode of the voltage stabilizing transistor; and the sixth transfer electrode comprises the third node.

For example, the display substrate provided by at least one embodiment of the present disclosure, further comprising a seventh transfer electrode, a first end of the seventh transfer electrode is connected to a second electrode of the output control transistor, and a second end of the seventh transfer electrode is connected to a second electrode of the output transistor; and the second electrode of the output transistor is connected to a second electrode of an input transistor of a next stage of shift register unit adjacent to the shift register unit.

For example, in the display substrate provided by at least one embodiment of the present disclosure, an active layer of the output control transistor and at least part of an active layer of the output transistor are in a second semiconductor layer that is continuous, and the second semiconductor layer extends along the first direction; and a gate electrode of the output control transistor and a gate electrode of the output transistor extend along the second direction and are arranged side by side in the first direction, and a first electrode of the output control transistor is connected to the first power line to receive the first voltage.

At least one embodiment of the present disclosure also provides a display device, which comprises the display substrate in any of the above embodiments.

At least one embodiment of the present disclosure also provides a manufacture method of a display substrate, comprising: providing a base substrate, the base substrate comprising a display region and a peripheral region at least surrounding the display region, and forming a shift register unit, a first clock signal line, a second clock signal line, a first power line, and a second power line on the peripheral region of the base substrate, comprising: forming a semiconductor layer on the base substrate, and performing a patterning process on the semiconductor layer to form active layers of a plurality of transistors of respective circuits of the shift register unit; forming a first insulation material layer on a side of the active layers of the plurality of transistors away from the base substrate, and performing a patterning process on the first insulation material layer to form a first insulation layer, and the first insulation layer comprising holes; forming a first conductive material layer on a side of the first insulation layer away from the base substrate, and performing a patterning process on the first conductive material layer to form gate electrodes of the plurality of transistors, a plurality of connection wiring lines, and first electrodes of a plurality of capacitors of the respective circuits; forming a second insulation material layer on a side of the gate electrodes of the plurality of transistors away from the base substrate, and performing a patterning process on the second insulation material layer to form a second insulation layer, and the second insulation layer comprising holes; forming a second conductive material layer on a side of the second insulation layer away from the base substrate, and performing a patterning process on the second conductive material layer to form second electrodes of the plurality of capacitors; forming a third insulation material layer on a side of the second insulation layer and the second electrodes of the plurality of capacitors away from the base substrate, and performing a patterning process on the third insulation material layer to form a third insulation layer, and the third insulation layer comprising holes; forming a third conductive material layer on a side of the third insulation layer away from the base substrate, and performing a patterning process on the third conductive material layer to form first electrodes and second electrodes of the plurality of transistors, a plurality of transfer electrodes, the first clock signal line, the second clock signal line, the first power line, and the second power line, a first electrode and a second electrode of each transistor are connected to an active layer of the each transistor through holes penetrating through the first insulation layer, the second insulation layer, and the third insulation layer, and each transistor and each capacitor are connected to each other and are connected to the first power line, the second power line, the first clock signal line, and the second clock signal line through the plurality of connection wiring lines or the plurality of transfer electrodes and through holes penetrating through the second insulation layer and the third insulation layer.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

DETAILED DESCRIPTION

Figure 1A:
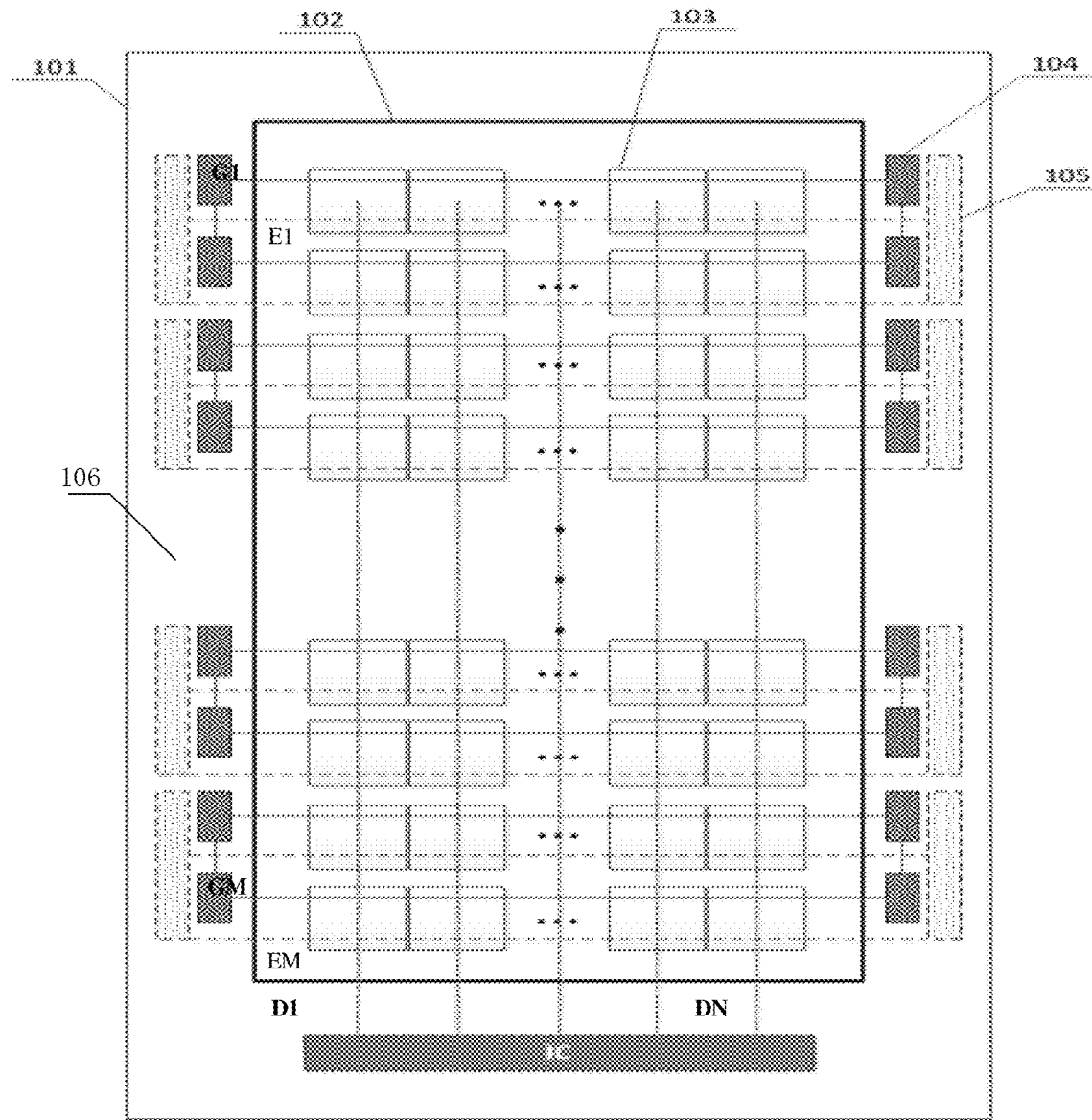
FIG. 1A is a schematic diagram of an overall circuit structure of a display panel.

In order to make objects, technical solutions, and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and in the case where the position of the object which is described is changed, the relative position relationship may be changed accordingly.

In a field of display technology, for example, a pixel array of a liquid crystal display panel or an organic light-emitting diode (OLED) display panel usually includes a plurality of rows of gate lines and a plurality of columns of data lines interlaced with the gate lines. The gate lines can be driven by a bonded integrated drive circuit. In recent years, with the continuous improvement of the manufacturing process of amorphous silicon thin film transistors or oxide thin film transistors, the gate line driving circuit may also be directly integrated on a thin film transistor array substrate to form GOA (Gate driver On Array) to drive the gate lines. For example, a GOA including a plurality of cascaded shift register units can be used to provide switching state voltage signals (scan signals) for the plurality of rows of gate lines of the pixel array, so as to, for example, control the plurality of rows of gate lines to turn on sequentially, and at the same time, the data lines providing data signals to the pixel units of the corresponding rows in the pixel array, so as to form gray voltages required for respective gray scales for displaying an image in respective pixel units, and then display a frame of image. The size of GOA will directly affect the size of the frame of the display panel. The smaller the frame of the display panel, the higher the screen-to-body ratio can be achieved, which makes the display effect better. The overall circuit structure of the display panel will be introduced below in conjunction with the drawings.

FIG. 1A is a schematic diagram of an overall circuit structure of a display panel. For example, as shown in FIG. 1A, a display panel comprises a base substrate 101, the base substrate 101 includes a display region (that is, a pixel array region) 102 and a peripheral region 106 located at the periphery of the display region 102. For example, the peripheral region 106 surrounds the display region 102. The display region 102 includes pixel units 103 arranged in an array, and the peripheral region 106 includes shift register units 104, a plurality of shift register units 104 that are cascaded constitute a gate drive circuit for providing, for example, gate scan signals shifted row by row to the pixel units 103 arranged in an array in the display region 102 of the display panel. The peripheral region 106 also includes light-emitting control units 105. A plurality of light-emitting control units that are cascaded 105 form a light-emitting control array for providing, for example, light-emitting control signals shifted row by row to the pixel units 103 arranged in the array in the display region 102 of the display panel.

As shown in FIG. 1A, the display panel further includes a data driving chip IC located in the peripheral region 106, and the data driving chip IC is configured to provide data signals to the pixel units 103 arranged in an array. The data lines D1-DN (N is an integer greater than 1) connected to the data driving chip IC longitudinally (for example, a vertical direction in the figure) pass through the display region 102 to provide data signals for the pixel units 103 in each column. The gate line G1-GM (M is an integer greater than 1) connected to the shift register units 104 pass through the display region 102 laterally (for example, a horizontal direction in the figure) and the light-emitting control lines E1-EM (M is an integer greater than 1) connected to the light-emitting control units 105 traverse the display region 102 to provide gate scan signals and light-emitting control signals for the pixel units 103 arranged in an array.

For example, each pixel unit 103 may include a pixel circuit having a circuit structure such as 7T1C, 8T2C, or 4T1C in the art, and a light-emitting element, the pixel circuit operates under control of a data signal transmitted through a data line, a gate scan signal transmitted through a gate line, and a light-emitting control signal transmitted through a light-emitting control line E1-EM to drive the light-emitting element to emit light to achieve display and other operations. The light-emitting element may be, for example, an organic light-emitting diode (OLED) or a quantum dot light-emitting diode (QLED).

Figure 1B:
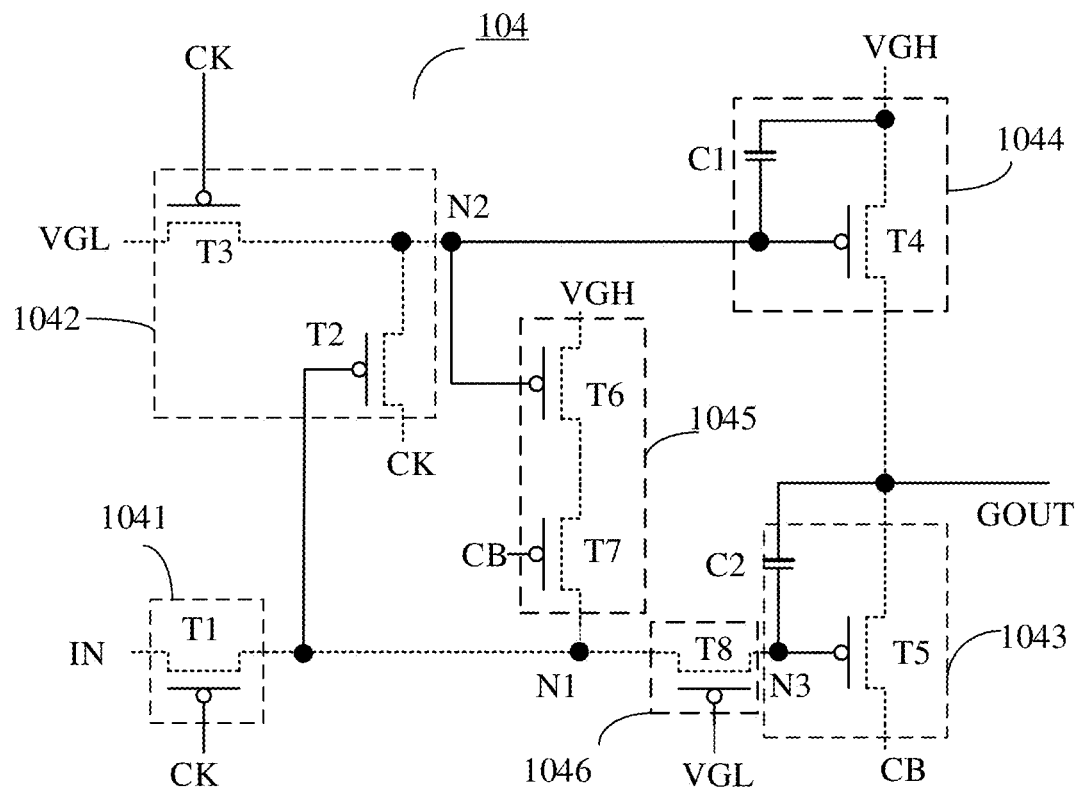
FIG. 1B is a circuit diagram of a shift register unit.
Figure 1C:
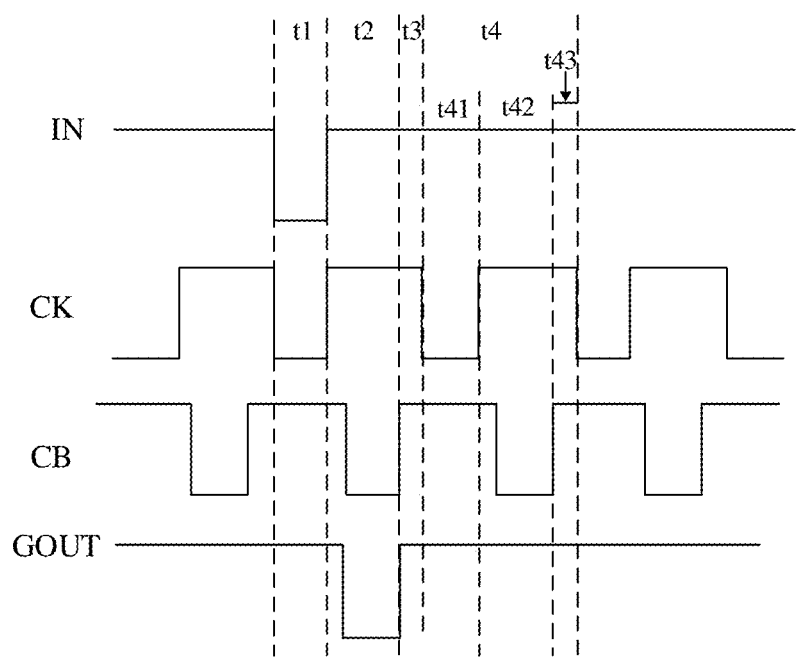
FIG. 1C is a signal timing diagram of the shift register unit shown in FIG. 1B during operation.

FIG. 1B is a circuit diagram of a shift register unit. FIG. 1C is a signal timing diagram of the shift register unit shown in FIG. 1B during operation. The working process of the shift register unit will be briefly introduced below in conjunction with FIG. 1B and FIG. 1C.

As shown in FIG. 1B, the shift register unit 104 includes 8 transistors (an input transistor T1, a first control transistor T2, a second control transistor T3, an output control transistor T4, an output transistor T5, a first noise reduction transistor T7, a second noise reduction transistors T6, and a voltage stabilizing transistor T8) and two capacitors (a first capacitor C1 and a second capacitor C2). For example, in the case where a plurality of shift register units 104 are cascaded, a second electrode of an input transistor T1 in a first stage of shift register unit is connected to an input terminal IN, the input terminal IN is configured to be connected to a trigger signal line GSTV (not shown in the figure) to receive a trigger signal as an input signal, an input terminal IN connected to a second electrode of an input transistor T1 in a shift register unit 104 in other stages (for example, except the first stage of shift register unit) is electrically connected to an output terminal of a previous stage of shift register unit 104, to receive an output signal output by the output terminal GOUT of the previous stage of shift register unit 104 as an input signal, thereby achieving shift output to perform, for example, progressive scanning on an array of pixel units 103 in the display region 102.

In addition, in the example shown in FIG. 1B, the shift register unit 104 further includes a first clock signal terminal CK and a second clock signal terminal CB. GCK represents the first clock signal line, and GCB represents the second clock signal line. For example, the first clock signal terminal CK is connected to the second clock signal line GCB or the first clock signal line GCK to receive a first clock signal. For example, in the case where the first clock signal terminal CK is connected to the first clock signal line GCK, the first clock signal line GCK provides the first clock signal, and in the case where the first clock signal terminal CK is connected to the second clock signal line GCB, the second clock signal line GCB provides the first clock signal; the specific situations depend on the actual situation, and the embodiments of the present disclosure are not limited to this case. The second clock signal terminal CB is connected to the second clock signal line GCB or the first clock signal line GCK to receive a second clock signal. In the following, the case where the first clock signal terminal CK is connected to the first clock signal line GCK to receive the first clock signal, and the second clock signal terminal CB is connected to the second clock signal line GCB to receive the second clock signal is taken as an example to describe the present disclosure, and the embodiments of the present disclosure are not limited to this case. For example, the first clock signal GCK and the second clock signal GCB may use pulse signals with a duty cycle greater than 50%, and the difference between the two is, for example, half a cycle; VGH represents the first power line and the first voltage provided by the first power line, for example, the first voltage is a DC high level, VGL represents the second power line and the second voltage provided by the second power line, for example, the second voltage is a DC low level, and the first voltage is greater than the second voltage; N1, N2, and N3 respectively represent the first node, the second node, and the third node in the circuit diagram.

As shown in FIG. 1B, a gate electrode of the input transistor T1 is connected to the first clock signal terminal CK (the first clock signal terminal CK is connected to the first clock signal line GCK) to receive the first clock signal, a second electrode of the input transistor T1 is connected to the input terminal IN, and a first electrode of the input transistor T1 is connected to the first node N1. For example, in the case where the shift register unit 104 is the first stage of shift register unit, the input terminal IN is connected to the trigger signal line GSTV (not shown in the figure) to receive the trigger signal, in the case where the shift register unit 104 is a shift register unit in other stages except the first stage of shift register, the input terminal IN is connected to the output terminal GOUT of the previous stage of shift register unit.

A gate electrode of the first control transistor T2 is connected to the first node N1, a second electrode of the first control transistor T2 is connected to the first clock signal terminal CK (the first clock signal terminal CK is connected to the first clock signal line GCK) to receive the first clock signal, and a first electrode of the first control transistor T2 is connected to the second node N2.

A gate electrode of the second control transistor T3 is connected to the first clock signal terminal CK (the first clock signal terminal CK is connected to the first clock signal line GCK) to receive the first clock signal, a second electrode of the second control transistor T3 is connected to the second power line VGL to receive the second voltage, and a first electrode of the second control transistor T3 is connected to the second node N2.

A gate electrode of the output control transistor T4 is connected to the second node N2, a first electrode of the output control transistor T4 is connected to the first power line VGH to receive the first voltage, and a second electrode of the output control transistor T4 is connected to the output terminal GOUT.

A first electrode of the first capacitor C1 is connected to the second node N2, and a second electrode of the first capacitor C1 is connected to the first power line VGH.

A gate electrode of the output transistor T5 is connected to the third node N3, a first electrode of the output transistor T5 is connected to the second clock signal terminal CB (the second clock signal terminal CB is connected to the second clock signal line GCB), and a second electrode of the output transistor T5 is connected to the output terminal GOUT.

A first electrode of the second capacitor C2 is connected to the third node N3, and a second electrode of the second capacitor C2 is connected to the output terminal GOUT.

A gate electrode of the first noise reduction transistor T7 is connected to the second clock signal terminal CB (the second clock signal terminal CB is connected to the second clock signal line GCB) to receive the second clock signal, and a first electrode of the first noise reduction transistor T7 is connected to the first node N1.

A gate electrode of the second noise reduction transistor T6 is connected to the second node N2, a first electrode of the second noise reduction transistor T6 is connected to the first power line VGH to receive the first voltage, and a second electrode of the second noise reduction transistor T6 is connected to a second electrode of the first noise reduction transistor T7.

A gate electrode of the voltage stabilizing transistor T8 is connected to the second power line VGL to receive the second voltage, a first electrode of the voltage stabilizing transistor T8 is connected to the first node N1, and a second electrode of the voltage stabilizing transistor T8 is connected to the third node N3.

The transistors in the shift register unit 104 shown in FIG. 1B are all described by using P-type transistors as an example, that is, each transistor is turned on in the case where a gate electrode of the transistor is connected to a low level (turned-on level), and is turned off in the case where the gate electrode of the transistor is connected to a high level (turned-off level). In this case, the first electrode of the transistor can be a source electrode, and the second electrode of the transistor can be a drain electrode. In other embodiments, the first electrode and the second electrode of the transistor can be interchanged.

The shift register unit includes, but is not limited to, the configuration shown in FIG. 1B, for example, respective transistors in the shift register unit 104 may also adopt N-type transistors or a combination of P-type transistors and N-type transistors, so long as the respective port polarities of the selected type transistor are connected according to the port polarities of the corresponding transistor in the embodiments of the present disclosure.

It should be noted that the transistors used in the shift register unit can all be thin film transistors or field effect transistors or other switching devices with the same characteristics. Here, thin film transistors are used as examples for description. For example, an active layer (channel region) of the transistor is made of semiconductor materials, such as polysilicon (such as low-temperature polysilicon or high-temperature polysilicon), amorphous silicon, indium gallium tin oxide (IGZO), etc., while a gate electrode, a source electrode, a drain electrode, etc. of the transistor are made of metal materials, such as metal aluminum or aluminum alloy. The source electrode and the drain electrode of the transistor used here can be symmetrical in structure, and therefore, the source electrode and the drain electrode of the transistor can have no difference in structure. In the embodiments of the present disclosure, in order to distinguish the two electrodes of the transistor other than the gate electrode, one electrode of the two electrodes is directly described as a first electrode and the other electrode of the two electrodes is described as a second electrode. In addition, in the embodiments of the present disclosure, the electrodes of the capacitor may be metal electrodes or one of the electrodes of the capacitor may be made of a semiconductor material (for example, doped polysilicon).

FIG. 1C is a signal timing diagram of the shift register unit 104 shown in FIG. 1B during operation. The working process of the shift register unit will be described in detail below in conjunction with FIG. 1B and FIG. 1C. For example, the working principle of the shift register unit 104 is described, and the working principles of the shift register units 104 in the other stages (except the first stage of shift register unit) are similar to this case, and will not be repeated. However, the working principle of the first stage of register unit is different from the shift register unit 104 in that: the input terminal of the first stage of register unit is connected to the trigger signal line GSTV, while the input terminal of the shift register unit 104 is connected to the output terminal of the previous stage of shift register unit. As shown in FIG. 1C, the working process of the shift register unit 104 includes 4 phases, namely a first phase t1, a second phase t2, a third phase t3, and a fourth phase t4, and FIG. 1C shows the timing waveforms of the various signals in each phase.

In the input phase t1, as shown in FIG. 1C, the first clock signal provided on the first clock signal terminal CK is a low-level signal, and the second clock signal provided on the second clock signal terminal CB is a high-level signal. The input terminal IN receives the trigger signal (for example, the input signal Vin) provided by the output terminal of the previous stage of shift register unit, for example, the input signal Vin is equal to the low-level signal VL provided by the second power line VGL. Because the first clock signal is a low-level signal, the input transistor T1 is turned on, and the input signal is transmitted to the first node N1 via the input transistor T1. Because the input transistor T1 has a threshold loss when transmitting a low-level signal, a voltage of the first node N1 is Vin-Vth1, that is, VL-Vth1, where Vth1 represents the threshold voltage of the input transistor T1. Because the gate electrode of the voltage stabilizing transistor T8 receives the low-level signal VL provided by the second power line VGL, the voltage stabilizing transistor T8 is in a turned-on state, and thus, the voltage VL-Vth1 is transmitted to the third node N3 via the voltage stabilizing transistor T8. For example, the threshold voltage of the voltage stabilizing transistor T8 is expressed as Vth8. Similarly, because the voltage stabilizing transistor T8 has a threshold loss when transmitting a low-level signal, the voltage of the third node N3 is VL-VthN1, where VthN1 is the smaller one of Vth1 and Vth8. The voltage of the third node N3 can control the output transistor T5 to be turned on, and the second clock signal is written into the output terminal GOUT via the output transistor T5 and serves as an output signal, that is, in the input phase t1, the output signal is a high-level second clock signal, that is, the high-level signal VH provided by the first power line VGH.

In the input phase t1, because the first clock signal is a low-level signal, the second control transistor T3 is turned on, and the low-level signal VL provided by the second power line VGL is transmitted to the second node N2 via the second control transistor T3, because the voltage of the first node N1 is VL-Vth1, the first control transistor T2 is turned on, and the low-level first clock signal is transmitted to the second node N2 via the first control transistor T2. For example, the threshold voltage of the first control transistor T2 is expressed as Vth2, and the threshold voltage of the second control transistor T3 is expressed as Vth3, in the case where Vth3<Vth2+Vth1, the voltage of the second node N2 is VL-Vth2-Vth1; while in the case where Vth3>Vth2+Vth1, the voltage of the second node N2 is VL-Vth3. In this case, the output control transistor T4 and the first noise reduction transistor T6 are both turned on. Because the second clock signal is a high-level signal, the second noise reduction transistor T7 is turned off.

In the output phase t2, the first clock signal provided on the first clock signal terminal CK is a high-level signal, the second clock signal provided on the second clock signal terminal CB is a low-level signal, the input terminal IN receives the input signal Vin provided by the output terminal of the previous stage of shift register unit as a high-level signal. The output transistor T5 is turned on, and the second clock signal is written into the output terminal GOUT via the output transistor T5 and serves as an output signal. In the input phase t1, the voltage at the end, which is connected to the output terminal GOUT, of the second capacitor C2 is the high-level signal VH provided by the first power line VGH, and the voltage at the end, which is connected to the third node N3, of the second capacitor C2 is VL-VthN1, however in the output phase t2, the voltage at the end, which is connected to the output terminal GOUT, of the second capacitor C2 becomes the low-level signal VL provided by the second power line VGL, due to the bootstrap effect of the second capacitor C2, the voltage at the end, which is connected to the third node N3, of the second capacitor C2 becomes 2VL-VthN1-VH, that is, the voltage of the third node N3 becomes 2VL-VthN1-VH, in this case, the voltage stabilizing transistor T8 is turned off, the output transistor T5 can be better turned on, and the output signal is the low-level signal VL provided by the second power line VGL.

In the output phase t2, the first clock signal is a high-level signal, so that both the input transistor T1 and the second control transistor T3 are turned off. The voltage of the first node N1 is still VL-VthN1, the first control transistor T2 is turned on, and the high-level first clock signal is transmitted to the second node N2 via the first control transistor T2, that is, the voltage of the second node N2 is high-level signal VH, and thus, both the output control transistor T4 and the second noise reduction transistor T6 are turned off. Because the second clock signal is a low-level signal, the first noise reduction transistor T7 is turned on.

In the buffer phase t3, the first clock signal provided on the first clock signal terminal CK and the second clock signal provided on the second clock signal terminal CB are both high-level signals, and the input terminal IN receives the input signal Vin provided by the output terminal of the previous stage of shift register unit as a high-level signal. The output transistor T5 is turned on, and the second clock signal is written into the output terminal GOUT via the output transistor T5 and serves as an output signal, in this case, the output signal is a high-level second clock signal, that is, a high-level signal VH. Due to the bootstrap effect of the second capacitor C2, the voltage of the third node N3 becomes VL-VthN1.

In the buffer phase t3, the first clock signal is a high-level signal, so that the input transistor T1 and the second control transistor T3 are both turned off. The voltage of the third node N3 becomes VL-VthN1. In this case, the voltage stabilizing transistor T8 is turned on, the voltage of the first node N1 is also VL-VthN1, and the first control transistor T2 is turned on, the high-level first clock signal is transmitted to the second node N2 via the first control transistor T2, that is, the voltage of the second node N2 is the high-level signal VH, as a result, both the second noise reduction transistor T6 and the output control transistor T4 are turned off. Because the second clock signal is a high-level signal, the second noise reduction transistor T7 is turned off.

In a first sub-phase t41 of the stabilization phase t4, the first clock signal provided on the first clock signal terminal CK is a low-level signal, the second clock signal provided on the second clock signal terminal CB is a high-level signal, and the input terminal IN receives the input signal Vin provided by the output terminal of the previous stage of shift register unit as a high-level signal, for example, the input signal Vin is equal to the high-level signal VH provided by the first power line VGH. Because the first clock signal is a low-level signal, the input transistor T1 is turned on, and the input signal Vin is transmitted to the first node N1 via the input transistor T1, because the input transistor T1 does not have the threshold loss in the case where transmitting a high-level signal, the voltage of the first node N1 is the input signal Vin (i.e., the high-level signal VH), and the first control transistor T2 is turned off. Because the voltage stabilizing transistor T8 is in the turned-on state, the voltage of the third node N3 is the same as the voltage of the first node N1, that is, the voltage of the third node N3 is VH, and the output transistor T5 is turned off. Because the first clock signal is a low-level signal, the second control transistor T3 is turned on, the voltage of the second node N2 is VL−Vth1, the second noise reduction transistor T6 and the output control transistor T4 are both turned on, the high-level signal VH is transmitted to the output terminal GOUT via the output control transistor T4, that is, the output signal is the high-level signal VH.

In a second sub-phase t42 of the stabilization phase t4, the first clock signal provided on the first clock signal terminal CK is a high-level signal, the second clock signal provided on the second clock signal terminal CB is a low-level signal, and the input terminal IN receives the input signal Vin provided by the output terminal of the previous stage of shift register unit as a high-level signal. The voltages of the first node N1 and the third node N3 are the input signal Vin (i.e., the high-level signal VH provided by the first power line VGH), and the first control transistor T2 and the output transistor T5 are both turned off. The first clock signal is a high-level signal, so that the input transistor T1 and the second control transistor T3 are both turned off. Due to the holding effect of the first capacitor C1, the voltage of the second node N2 is still VL−Vth3, the output control transistor T4 and the first noise reduction transistor T6 are both turned on, the high-level signal VH is transmitted to the output terminal GOUT through the output control transistor T4, and the output signal is a high-level signal VH.

In the second sub-phase t42, because the second clock signal is a low-level signal, the second noise reduction transistor T7 is turned on, and therefore, the high-level signal VH is transmitted to the third node N3 and the first node N1 via the first noise reduction transistor T6 and the second noise reduction transistor T7, so that the voltage of the first node N1 and the voltage of the third node N3 are maintained at a high level.

In a third sub-phase t43 of the stabilization phase t4, the first clock signal provided on the first clock signal terminal CK and the second clock signal provided on the second clock signal terminal CB are both high-level signals, the input terminal IN receives the input signal Vin provided by the output terminal of the previous stage of shift register unit as a high-level signal. The voltage of the first node N1 and the voltage of the third node N3 are the high-level signals VH, and the first control transistor T2 and the output transistor T5 are turned off. The first clock signal is a high-level signal, so that the input transistor T1 and the second control transistor T3 are both turned off, the voltage of the second node N2 is still VL−Vth3, and the output control transistor T4 and the first noise reduction transistor T6 are both turned on. The high-level signal VH is transmitted to the output terminal GOUT via the output control transistor T4, and the output signal is a high-level signal VH.

Figure 1D:
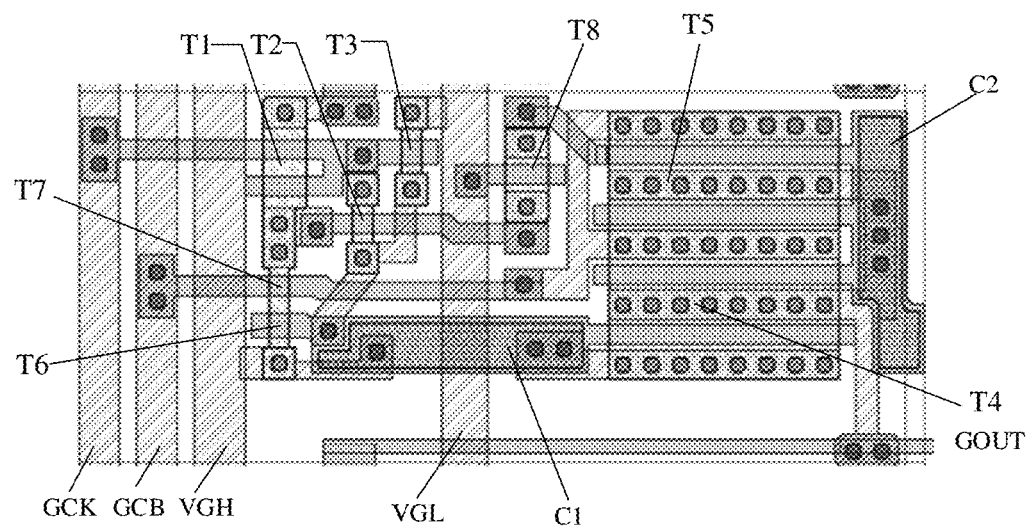
FIG. 1D is a schematic diagram of a layout of the shift register unit shown in FIG. 1B on a display substrate.

FIG. 1D is a schematic diagram of a layout of the shift register unit 104 shown in FIG. 1B on a display substrate. As shown in FIG. 1D, the display substrate includes the input transistor T1 to the voltage stabilizing transistor T8 of the shift register unit 104, the first capacitor C1 and the second capacitor C2, the first clock signal line GCK, the second clock signal line GCB, and the second clock signal line GCK, the first power line VGH, and the second power line VGL.

For example, as shown in FIG. 1D, the voltage stabilizing transistor T8 is located on a side of the first control transistor T2 and the second power line VGL close to the display region (for example, the output terminal GOUT in FIG. 1D extends toward the display region 102), the first noise reduction transistor T7 and the second noise reduction transistor T6 are located on a side of the first control transistor T2 and the second power line VGL away from the display region, so that a connection wiring line and two transfer wiring lines need to be used to connect the first electrode of the voltage stabilizing transistor T8 and the first electrode of the first noise reduction transistor T7, moreover, the connection wiring line overlap with a plurality of wiring lines (for example, the second power line VGL, the active layer of the first control transistor T2, etc.), which increases the parasitic capacitors of the circuit and enables the space utilization rate very low. It should be noted that the parasitic capacitors may include a plane parasitic capacitor, a space parasitic capacitor, and the like. In the display substrate, plane parasitic capacitors can be formed in the case where orthographic projections of elements, such as transfer electrodes, connection wiring lines, and gate electrodes, located on different layers in a direction perpendicular to the base substrate overlap with each other, in addition, space parasitic capacitors (or called 3D parasitic capacitors) can be formed in the case where the elements, such as the transfer electrodes, connection wiring lines, and gate electrodes, located in the same layer are, for example, arranged side by side in a plane direction. The gate electrode of the first noise reduction transistor T7 is connected to the first electrode of the output transistor T5 and overlaps a plurality of wiring lines (for example, the first power line VGL, the transfer line between the first electrode of the first control transistor T2 and the gate electrode of T6), which increases the parasitic capacitors of the circuit and wiring complexity. Therefore, the arrangement mode and connection mode of the various transistors on the display substrate shown in FIG. 1D cause a lot of overlapping of wiring lines and increase the number of connection wiring lines, thereby increasing the parasitic capacitors of the circuit and wiring complexity, but reducing the space utilization rate and increasing the space occupied by the gate drive circuit, which is not conducive to achieving the narrow frame design of the display panel, and is easy to cause problems such as signal interference due to excessive parasitic capacitance causing by unnecessary overlap, which affects the display quality of the display panel. Therefore, a more concise wiring layout of the gate drive circuit is beneficial to improve the space utilization rate of the display panel, thereby easily achieving a narrow frame of the display panel, increasing the screen-to-body ratio, and achieving a more stunning display effect.

At least one embodiment of the present disclosure provides a display substrate, comprising: a base substrate, comprising a display region and a peripheral region on at least one side of the display region; and a shift register unit, a first clock signal line, and a second clock signal line which are arranged on the peripheral region of the base substrate. The first clock signal line and the second clock signal line extend along a first direction on the base substrate, and are configured to respectively provide a first clock signal and a second clock signal to the shift register unit, the shift register unit comprises an input circuit, an output circuit, a first control circuit, a second control circuit, and a voltage stabilizing circuit, the input circuit is configured to input an input signal to a first node in response to the first clock signal; the first control circuit is connected to the first node and a second node, and is configured to control a level of the second node in response to a level of the first node and the first clock signal; the second control circuit is connected to the first node and the second node, and is configured to control the level of the first node under control of the level of the second node and the second clock signal; the voltage stabilizing circuit is connected to the first node and a third node, and is configured to stabilize a level of the third node; the output circuit is connected to the third node, and is configured to output an output signal to an output terminal under control of the level of the third node; the first control circuit comprises a first control transistor, the second control circuit comprises a first noise reduction transistor, the voltage stabilizing circuit comprises a voltage stabilizing transistor, a gate electrode of the first control transistor, a first electrode of the first noise reduction transistor, and a first electrode of the voltage stabilizing transistor are all connected to the first node; the first electrode of the first noise reduction transistor and the first electrode of the voltage stabilizing transistor are in a first source-drain electrode layer, and the first source-drain electrode layer comprises a first transfer electrode, and the first transfer electrode comprises a first portion extending in parallel along a second direction different from the first direction and a second portion integrally formed with the first portion and extending along the first direction, a first end of the first portion is connected to the first electrode of the first noise reduction transistor, a second end of the first portion is connected to the first electrode of the voltage stabilizing transistor, and the second portion is connected to the gate electrode of the first control transistor that is not in a same layer as the second portion.

At least one embodiment of the present disclosure also provides a display device corresponding to the above-mentioned display substrate and a manufacture method of the display substrate.

The display substrate provided by the above-mentioned embodiments of the present disclosure optimizes the circuit connection and structural layout of the shift register unit, reduces the number of overlapping wiring lines and the wiring complexity of the shift register unit to a certain extent, and increases the space utilization rate of the shift register unit, which is beneficial to achieve the narrow frame design of the display panel, and at the same time ensures the display quality of the display panel.

The embodiments of the present disclosure and some examples thereof will be described in detail below with reference to the accompanying drawings.

Figure 2:
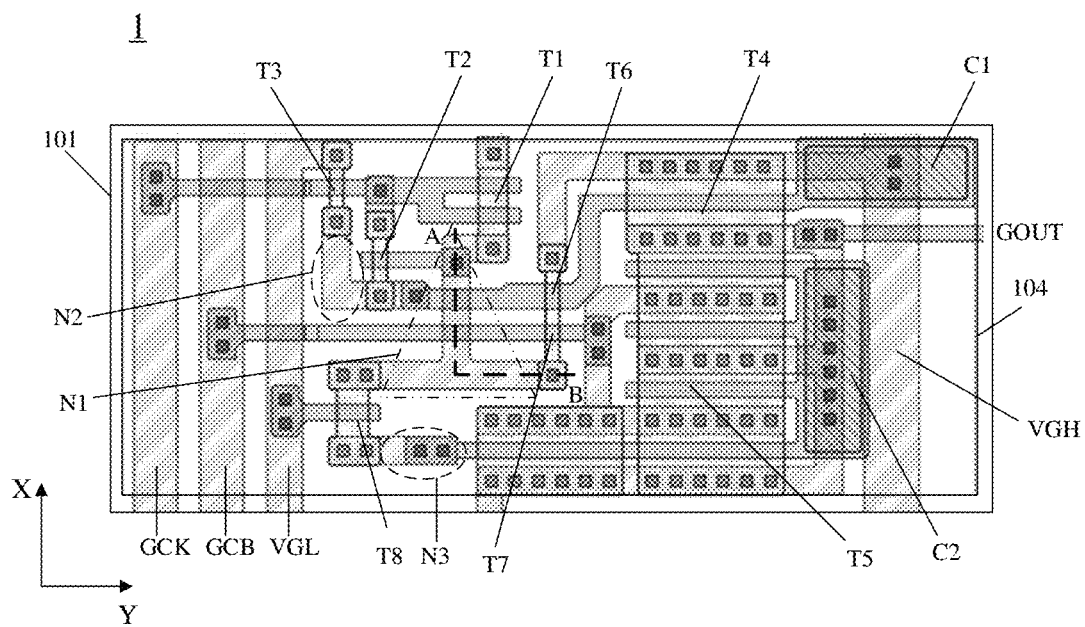
FIG. 2 is a schematic diagram of a layout of a display substrate provided by at least one embodiment of the present disclosure.

At least one embodiment of the present disclosure provides a display substrate. FIG. 2 is a schematic diagram of a layout of the shift register unit 104 as shown in FIG. 1B on the display substrate.

For example, as shown in FIG. 2, the display substrate 1 includes: a base substrate 101, and a shift register unit 104, a first power line VGH, a second power line VGL, and a plurality of clock signal lines (for example, a first clock signal line GCK and a second clock signal line GCB shown in the figure), which are provided on the base substrate 101. For example, the first power line VGH, the second power line VGL, and the plurality of clock signal lines extend along a first direction X on the base substrate 10, and are configured to provide the shift register unit 104 with a first voltage, a second voltage, and a plurality of clock signals (for example, the first clock signal or the second clock signal described above), respectively.

It should be noted that the first power line VGH, the second power line VGL, and the plurality of clock signal lines can all be arranged in parallel along the first direction X, or can also cross each other at a certain angle (for example, less than or equal to 20°). The embodiments of the present disclosure are not limited to this case.

It should be noted that the extension along the first direction refers to the extension directions of a main trunk of the first power line, a main trunk of the second power line, and main trunks of the plurality of clock signal lines, and does not include the protrusions, corners, or the like branched from the main trunk of each signal line.

For example, the first power line VGH is configured to provide a first voltage to a plurality of cascaded shift register units 104 included in the gate drive circuit, and the second power line VGL is configured to provide a second voltage to the plurality of cascaded shift register units 104 included in the gate drive circuit. For example, the first voltage is greater than the second voltage, for example, the first voltage is a DC high level, and the second voltage is a DC low level.

For example, the base substrate 101 may be made of, for example, glass, plastic, quartz, or other suitable materials, and the embodiments of the present disclosure are not limited in this aspect.

For example, the display substrate 1 includes a pixel array region (that is, the display region 102 shown in FIG. 1A, referred to as the pixel array region 102 below) and a peripheral region 106 (as shown in FIG. 1A) other than the pixel array region, for example, the above-mentioned first power line VGH, the above-mentioned second power line VGL, the above-mentioned plurality of clock signal lines, and the above-mentioned shift register unit 104 are located in the peripheral region 106 and on one side of the base substrate 101 (as shown in FIG. 1A, located between the pixel array region 102 and a side of the base substrate 101), for example, as shown in FIG. 1A, are located on the left side of the base substrate 101, of course, can also be located on the right side or the left and right sides of the base substrate 101, and the embodiments of the present disclosure are not limited to this case.

For example, the first clock signal GCK and the second clock signal line GCB are located on a side of the shift register unit 104 away from the display region 102. For example, an orthographic projection of the first power line VGH on the base substrate 101 is located on a side of an orthographic projection of the shift register unit 104 on the base substrate 101 close to the display region 102. For example, an orthographic projection of the second power line VGL on the base substrate 101 is located between an orthographic projection of the first clock signal line CGK and the second clock signal line CGB on the base substrate 101 and the orthographic projection of the shift register unit 104 on the base substrate 101. The above wiring arrangement can facilitate the connection of other wiring lines of the shift register 104 with the first clock signal GCK, the second clock signal line GCB, the first power line VGL, and the second power line VGH.

It should be noted that the above-mentioned wiring positions are only exemplary, as long as it can be satisfied that the wiring arrangement can facilitate the connection with the shift register unit 104, and the embodiments of the present disclosure are not limited to this case.

For example, the pixel array region 102 includes a plurality of pixel units 103 arranged in an array. For example, each of the plurality of pixel units 103 includes a pixel drive circuit, for example, may further include a light-emitting element (not shown in the figure).

For example, a plurality of shift register units 104 that are cascaded constitute a gate drive circuit. For example, output terminals GOUT of the plurality of shift register units 104 are respectively connected to the gate scan signal terminals of the pixel drive circuits of respective rows located in the pixel array region 102 to provide output signals (for example, gate scan signal) to the respective rows of the pixel circuits, so as to drive the light-emitting elements to emit light. For example, the pixel drive circuit may be a pixel circuit in the art including a circuit structure, such as 7T1C, 2T1C, 4T2C, 8T2C, etc., and will not be repeated here.

FIG. 2 shows only one stage of shift register units 104 in the gate drive circuit. For example, as shown in FIG. 2, a first clock terminal CK (as shown in FIG. 1B) of the shift register unit 104 is connected to the first clock signal GCK to receive the first clock signal, a second clock signal terminal CB (as shown in FIG. 1B) of the shift register unit 104 is connected to the second clock signal line GCB to receive the second clock signal, a first clock signal terminal CK of a next stage of shift register unit in the shift register units 104 is connected to the second clock signal line GCB to receive the first clock signal, a second clock signal terminal CB of the next stage of shift register unit in the shift register units 104 is connected to the first clock signal GCK to receive the second clock signal, and so on. For example, if the shift register unit 104 is used as a next stage of shift register unit of a first stage of shift register unit, a first clock signal terminal CK of an X-th (X is an even number greater than 1) stage of shift register unit is connected to the first clock signal line GCK to receive the first clock signal, a second clock signal terminal CB of the X-th stage of shift register unit is connected to the second clock signal line GCB to receive the second clock signal, a first clock terminal CK of a (X−1)-th stage of shift register unit 104 is connected to the second clock signal line GCB to receive the first clock signal, a second clock signal terminal CB of the (X−1)-th stage of shift register unit 104 is connected to the first clock signal GCK to receive the second clock signal. It should be noted that, the connection mode between each stage of the shift register units and the clock signal lines may also adopt other connection modes in the art, and is not limited in the embodiments of the present disclosure. For example, if an input terminal of a first stage of shift register unit is connected to the trigger signal line GSTV to receive the trigger signal as an input signal, an input terminal of the shift register unit in the other stages is connected to an output terminal GOUT of a previous stage of shift register unit (for example, an input terminal of a second stage of shift register unit is connected to the output terminal GOUT of the first stage of shift register unit). The following takes the structure of the shift register unit 104 as shown in FIG. 2 as an example for description, and the embodiments of the present disclosure are not limited in this aspect.

For example, as shown in FIG. 1B, in some examples, the shift register unit 104 includes an input circuit 1041, an output circuit 1043, a first control circuit 1042, a second control circuit 1045, and a voltage stabilizing circuit 1046. In other examples, the shift register unit 104 further includes an output control circuit 1044.

The input circuit 1041 is configured to input an input signal to a first node N1 in response to a first clock signal. For example, the input circuit 1041 is connected to the input terminal IN, the first node N1, and the first clock signal terminal CK, and is configured to be turned on under control of the first clock signal received by the first clock signal terminal CK to connect the input terminal IN with the first clock signal terminal CK, thereby inputting the input signal to the first node N1. For example, the input circuit 1041 is implemented as the above-mentioned input transistor T1, and the connection mode of the input transistor T1 can refer to the above description, and will not be repeated here.

The output circuit 1043 is connected to the third node N3 and is configured to output the output signal to the output terminal GOUT. For example, the output circuit 1043 is connected to the third node N3, the output terminal GOUT, and the second clock signal terminal CB, and is configured to be turned on under the control of the level of the third node N3, so that the second clock signal terminal CB is connected to the output terminal GOUT, thereby outputting the second clock signal at the output terminal GOUT, for example, outputting the low level of the second clock signal. For example, the output circuit 1043 is implemented as the above-mentioned output transistor T5 and the second capacitor C2, and the connection mode of the output transistor T5 and the second capacitor C2 can refer to the above description and will not be repeated here.

The first control circuit 1042 is connected to the first node N1 and the second node N2, and is configured to control the level of the second node N2 in response to the level of the first node N1 and the first clock signal. For example, the first control circuit is connected to the first node N1, the second node N2, and the first clock signal terminal CK, and is configured to be turned on under the control of the level of the first node N1, so that the second node N2 is connected to the first clock signal terminal CK, thereby providing the first clock signal provided by the first clock signal terminal CK to the second node N2. For example, the first control circuit 1042 is implemented as the first control transistor T2 and the second control transistor T3 described above. For the connection mode of the first control transistor T2 and the second control transistor T3, reference may be made to the above description, which will not be repeated here. It should be noted that the first control circuit 1042 is not limited to being connected to the first node N1, and can also be connected to other independent voltage terminal (providing the voltage same as the voltage of the first node N1) or a separately set circuit that is the same as the input circuit, the embodiments of the present disclosure are not limited to this case. The connections of other circuits of the shift register unit are similar to this, and will not be repeated here.

The second control circuit 1045 is connected to the first node N1 and the second node N2, and is configured to control the level of the first node N1 under the control of the level of the second node N2 and the second clock signal. For example, the second control circuit 1045 is connected to the first node N1, the second node N2, the first power line VGH, and the second clock signal terminal CB, and is configured to be turned on under the control of the level of the second node N2 and the second clock signal received by the second clock signal terminal CB, so that the first power line VGH is connected to the first node N1, thereby charging the potential of the first node N1 to a high level to prevent the output circuit 1042 from being turned on during the non-output phase, thereby avoiding false output. For example, the second control circuit 1045 is implemented as the first noise reduction transistor T6 and the second noise reduction transistor T7 described above. The connection mode of the first noise reduction transistor T6 and the second noise reduction transistor T7 can refer to the above description and will not be repeated here.

The voltage stabilizing circuit 1046 is connected to the first node N1 and the third node N3, and is configured to stabilize the level of the third node N3. For example, the voltage stabilizing circuit 1046 is connected to the first node N1, the third node N3, and the second power line VGL, and is configured to be turned on under the control of the second voltage provided by the second power line VGL, so that the first node N1 is connected to the third node N3. For example, the voltage stabilizing circuit 1046 is implemented as the voltage stabilizing transistor T8. For specific introduction of the voltage stabilizing circuit 1046, reference may be made to the description of the voltage stabilizing transistor T8 in FIG. 1B above, and similar portions will not be repeated here.

The output control circuit 1044 is configured to control the level of the output terminal GOUT under the control of the level of the second node N2. For example, the output control circuit 1044 is connected to the second node N2, the first power line VGH, and the output terminal GOUT, and is configured to connect the output terminal GOUT to the first power line VGH under the control of the level of the second node N2, so as to output the first voltage provided by the first power line VGH to the output terminal GOUT, in order to control the output terminal GOUT at a high level, thereby preventing the shift register unit from outputting incorrectly in the non-output phase. For example, the output control circuit 1044 is implemented as the output control transistor T4 and the first capacitor C1 mentioned above, and the connection mode of the output control transistor T4 and the first capacitor C1 can refer to the above description and will not be repeated here.

For example, the voltage stabilizing transistor T8 is always in a turned-on state under the control of the second voltage provided by the second power line VGL, so that the third node N3 is connected to the first node N1 through the voltage stabilizing transistor T8, thereby preventing the level of the third node N3 from leaking through the input transistor T1, the first control transistor T2, and the second noise reduction transistor T7 that are connected to the first node N1, and reducing the stress of the level of the third node N3 on the first control transistor T1 at the same time, which can help maintain the level of the third node N3, so that the output transistor T5 can be fully turned on during the output phase.

Figure 3:
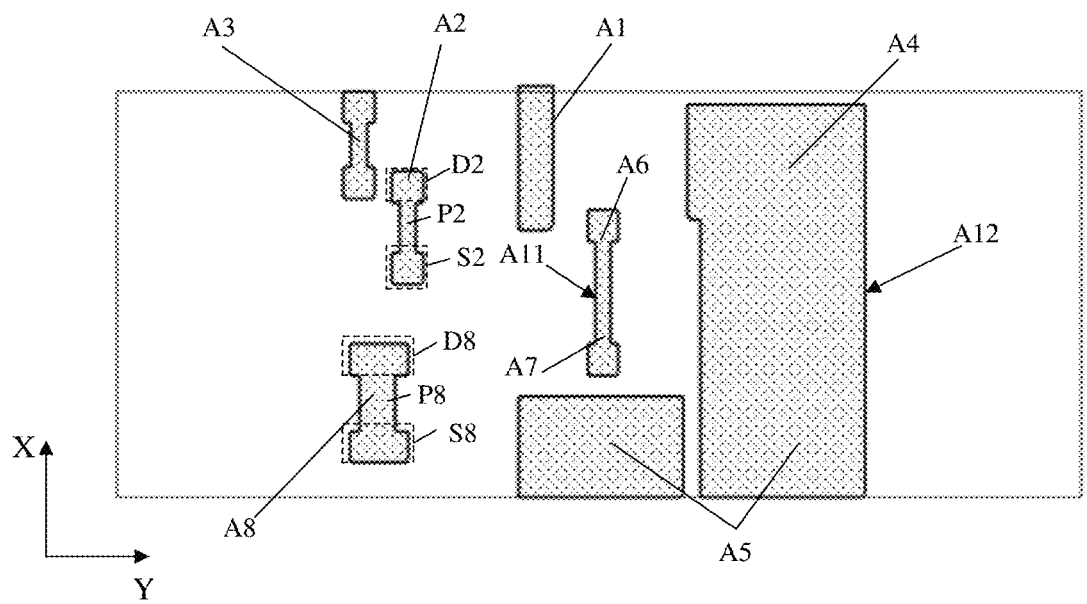
FIG. 3 is a plane view of a semiconductor layer of a display substrate provided by at least one embodiment of the present disclosure.
Figure 4:
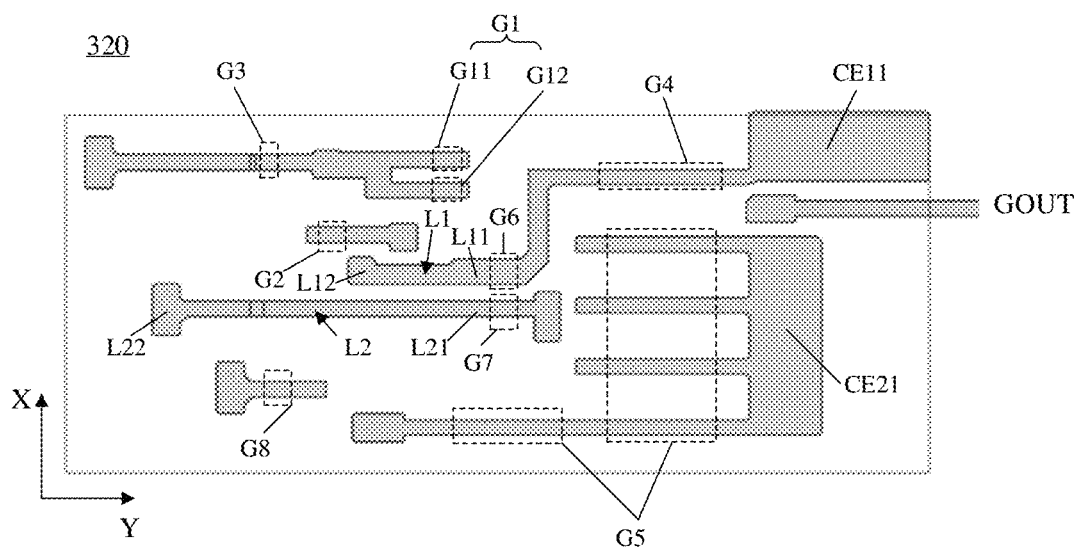
FIG. 4 is a plane view of a first conductive layer of a display substrate provided by at least one embodiment of the present disclosure.
Figure 5:
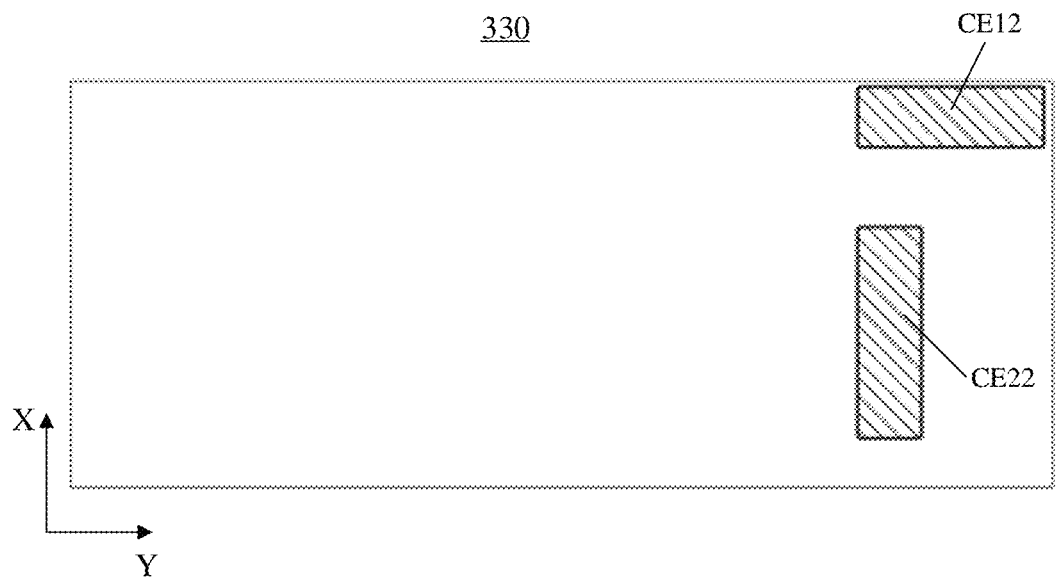
FIG. 5 is a plane view of a second conductive layer of a display substrate provided by at least one embodiment of the present disclosure.
Figure 6:
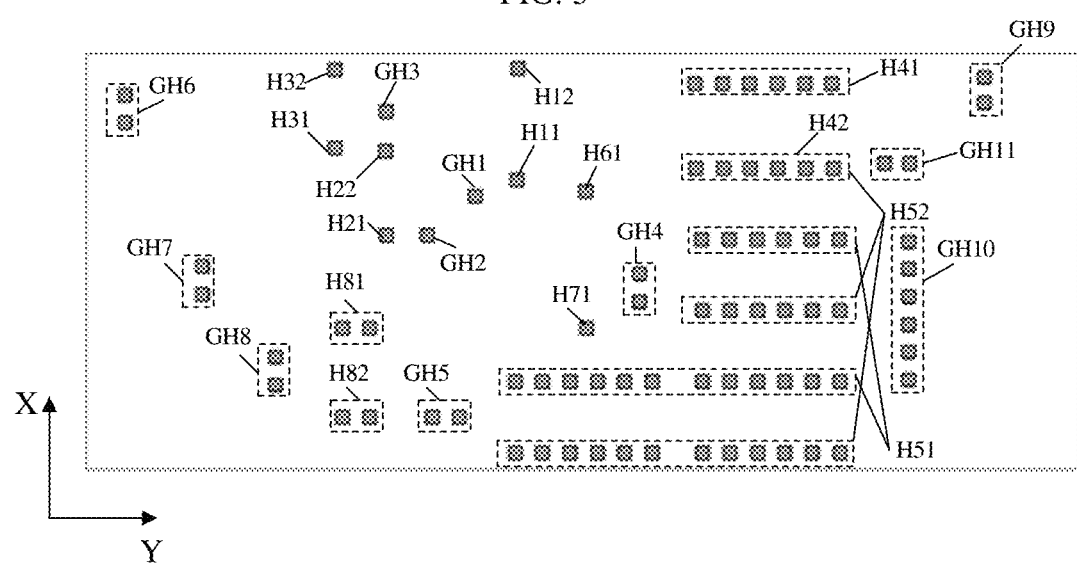
FIG. 6 is a distribution diagram of holes of a display substrate provided by at least one embodiment of the present disclosure.
Figure 7:
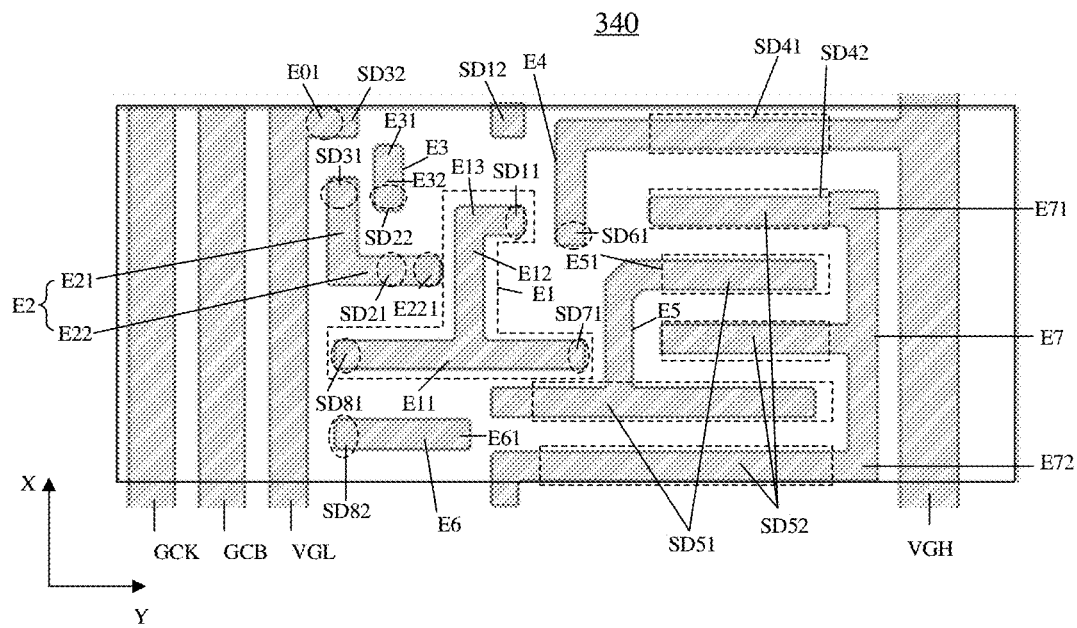
FIG. 7 is a plane view of a third conductive layer of a display substrate provided by at least one embodiment of the present disclosure.

FIGS. 3, 4, 5 and 7 respectively show plane views of wiring of respective layers of the shift register unit of the display substrate shown in FIG. 2, and FIG. 6 shows a distribution diagram of holes of the shift register unit of the display substrate shown in FIG. 2. FIG. 3 is a plane view of a semiconductor layer of a display substrate provided by at least one embodiment of the present disclosure; FIG. 4 is a plane view of a first conductive layer of a display substrate provided by at least one embodiment of the present disclosure; FIG. 5 is a plane view of a second conductive layer of a display substrate provided by at least one embodiment of the present disclosure; FIG. 6 is a distribution diagram of holes of a display substrate provided by at least one embodiment of the present disclosure; FIG. 7 is a plane view of a third conductive layer of a display substrate provided by at least one embodiment of the present disclosure; and FIG. 8 is a cross-section of the display substrate shown in FIG. 2 along a A-B direction.

For example, the display substrate 1 further includes a first insulation layer 350 (for example, a first gate insulation layer), a second insulation layer 360 (for example, a second gate insulation layer), and a third insulation layer 370 (for example, an interlayer insulation layer), which can be located between the layer structures shown in FIG. 3, FIG. 4, FIG. 5, and FIG. 7. For example, the first insulation layer 350 (as shown in FIG. 8) is located between the semiconductor layer 310 shown in FIG. 3 and the first conductive layer 320 shown in FIG. 4, the second insulation layer 360 (as shown in FIG. 8) is located between the first conductive layer 320 shown in FIG. 4 and the second conductive layer 330 shown in FIG. 5, and the third insulation layer 370 (shown in FIG. 8) is located between the second conductive layer 330 shown in FIG. 5 and the third conductive layer 340 shown in FIG. 7.

Figure 8:
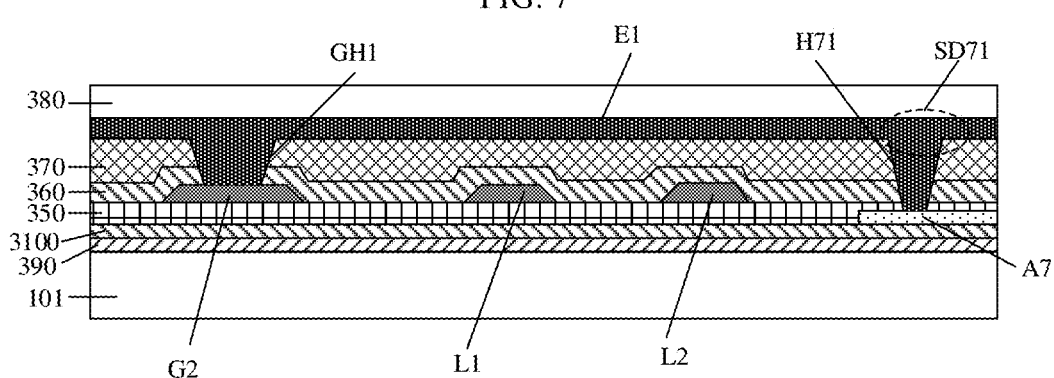
FIG. 8 is a cross-sectional view of the display substrate shown in FIG. 2 along a A-B direction.

For example, as shown in FIG. 8, the display substrate 1 further includes a fourth insulation layer 380, and the fourth insulation layer 380 is located on the third conductive layer 340 for protecting the third conductive layer 340.

For example, as shown in FIG. 8, the display substrate 1 further includes a blocking layer 390 and a buffer layer 3100. The buffer layer 3100 is located on a side of the first insulation layer 350 close to the base substrate 101, and the blocking layer 390 is located between the buffer layer 3100 and the base substrate 101. The blocking layer 390 and the buffer layer 3100 may provide a flat surface for forming the gate drive circuit, and may prevent impurities that may exist in the base substrate 101 from diffusing into the gate drive circuit to adversely affect the performance of the display substrate.

For example, the material of one or more selected from a group of the first insulation layer 350, the second insulation layer 360, the third insulation layer 370, the fourth insulation layer 380, the blocking layer 390, and the buffer layer 3100 may include inorganic insulation materials, such as silicon oxide, silicon nitride, silicon oxynitride, or other suitable materials, moreover, the material of the first insulation layer 350, the material of the second insulation layer 360, the material of the third insulation layer 370, the material of the fourth insulation layer 380, the material of the blocking layer 390, and the material of the buffer layer 3100 may be the same or different, and the embodiments of the present disclosure are not limited in this aspect.

It should be noted that the display substrate shown in FIG. 2 is described by taking the case that the layout design of one stage of shift register unit in the gate drive circuit and the first power line, the second power line, and the signal line connected to the one stage of shift register unit as an example, the layout implementation modes of the remaining shift register units at various stages can refer to the layout mode shown in FIG. 2, and will not be repeated here. Of course, other layout modes may also be adopted, and the embodiments of the present disclosure are not limited to this case. Of course, the remaining shift register units at various stages in the remaining gate drive circuits can also refer to the layout mode shown in FIG. 2, and other layout implementations can also be adopted, and the embodiments of the present disclosure are not limited to this case.

The display substrate provided by at least one embodiment of the present disclosure will be described in detail below with reference to FIGS. 2-8.

For example, the active layer A1 of the input transistor T1 of the shift register unit 104 shown in FIG. 2 to the active layer A8 of the voltage stabilizing transistor T8 of the shift register unit 104 shown in FIG. 2 may be formed of the semiconductor layer 310 shown in FIG. 3. The semiconductor layer 310 may be formed by patterning a semiconductor material. For example, as shown in FIG. 3, according to requirements, the semiconductor layer 310 can be in a short rod-shape or have a curved or bent shape, and can be used to manufacture the active layer A1 of the input transistor T1 to the active layer A8 of the voltage stabilizing transistor T8 mentioned above. Each active layer may include a source region, a drain region, and a channel region between the source region and the drain region. For example, the channel region has semiconductor characteristics; the source region and the drain region are on both sides of the channel region, respectively, and can be doped with impurities and therefore have conductivity. For example, the source region is a part of the active layer, and a metal electrode (for example, located in the third conductive layer 340) in contact with the source region corresponds to the source electrode (or called the first electrode) of the transistor; the drain region is a part of the active layer, and a metal electrode (for example, located in the third conductive layer 340) in contact with the drain region corresponds to the drain electrode (or called the second electrode) of the transistor. For example, the source region is connected to a metal electrode (first electrode) corresponding thereto through a hole penetrating through the first insulation layer 350, the second insulation layer 360, and the third insulation layer 370, and the drain region is connected to a metal electrode (second electrode) corresponding thereto through a hole penetrating through the first insulation layer 350, the second insulation layer 360, and the third insulation layer 370.

For example, as shown in FIG. 3, taking the first control transistor T2 as an example, the active layer A2 of the first control transistor T2 includes a source region S2, a drain region D2, and a channel region P2. For example, as shown in FIG. 4, the first control transistor T2 further includes a gate electrode G2, and the gate electrode G2 is located on the first conductive layer 320. Taking the voltage stabilizing transistor T8 as an example, as shown in FIG. 3, the active layer A8 of the voltage stabilizing transistor T8 includes a source region S8, a drain region D8, and a channel region P8. For example, as shown in FIG. 4, the voltage stabilizing transistor T8 further includes a gate electrode G8, and the gate electrode G8 is located on the first conductive layer 320, and the rest transistors are similar to those described here, and repeated portions will not be repeated.

For example, the material of the semiconductor layer 310 may include oxide semiconductors, organic semiconductors, or amorphous silicon, polysilicon, etc., for example, the oxide semiconductors include metal oxide semiconductors (such as indium gallium zinc oxide (IGZO)), and the polysilicon includes low-temperature polysilicon, high-temperature polysilicon, or the like, and the embodiments of the present disclosure are not limited to this case. It should be noted that the above-mentioned source region and drain region may be regions doped with n-type impurities or p-type impurities, which is not limited in the embodiments of the present disclosure.

It should be noted that in other examples, the first electrode and the second electrode of each transistor can also be located in other conductive layers, and are connected to their corresponding active layers through holes in an insulation layer between the conductive layer and the semiconductor layer. The embodiments of the present disclosure are not limited to this case.

FIG. 4 shows the first conductive layer 320 of the display substrate. The first conductive layer 320 is disposed on the first insulation layer 350 so as to be insulated from the semiconductor layer 310. For example, the first conductive layer 320 may include the first electrode CE11 of the first capacitor C1, the first electrode CE21 of the second capacitor C2, the gate electrode G1 of the input transistor T1 to the gate electrode G8 of the voltage stabilizing transistor T8, and various wiring lines (for example, the first connection wiring line L1 and the second connection wiring line L2) directly connected to the gate electrodes. As shown in FIG. 4, the gate electrode G1 of the input transistor T1 to the gate electrode G8 of the voltage stabilizing transistor T8 are the parts enclosed by dashed lines, that is, the parts where the semiconductor layer structures of respective transistors overlap with the wiring lines on the first conductive layer 320.

For example, the material of the first conductive layer 320 may include a metal material or an alloy material, such as a metal single-layer structure or a metal multi-layer structure formed by molybdenum, aluminum, titanium, and the like. For example, the multi-layer structure is a multi-metal stacked layer (such as a three-layer metal stacked layer of titanium, aluminum, and titanium (Ti/Al/Ti)).

FIG. 5 shows the second conductive layer 330 of the display substrate. The second conductive layer 330 is disposed on the second insulation layer 360 so as to be insulated from the first conductive layer 320. The second conductive layer 330 includes the second electrode CE12 of the first capacitor C1 to the second electrode CE22 of the second capacitor C2. The second electrode CE12 and the first electrode CE11 at least partially overlap to form the first capacitor C1, and the second electrode CE22 and the first electrode CE21 at least partially overlap to form the second capacitor C2.

For example, the material of the second conductive layer 330 may include a metal material or an alloy material, such as a metal single-layer structure or a metal multi-layer structure formed by molybdenum, aluminum, and titanium. For example, the multi-layer structure is a multi-metal stacked layer (such as a three-layer metal stacked layer of titanium, aluminum, and titanium (Ti/Al/Ti)).

FIG. 7 shows the third conductive layer 340 of the display substrate. The second conductive layer 330 is disposed on the third insulation layer 360 so as to be insulated from other conductive layers. The third conductive layer 340 includes a plurality of signal lines (for example, the first clock signal line GCK and the second clock signal line GCB), the first power line VGH, the second power line VGL, and the like. It should be noted that the third conductive layer 340 also includes the first electrode (for example, the source electrode connected to the source region of the active layer) and the second electrode (for example, the drain electrode connected to the drain region of the active layer) of each transistor, the first transfer electrode E1, the second transfer electrode E2, the third transfer electrode E3, and the fourth transfer electrode, the fifth transfer electrode E5, the sixth transfer electrode E6, the seventh transfer electrode E7, which are connected among the transistors, the capacitors, and signal lines, and so on.

For example, the material of the third conductive layer 340 may include a metal material or an alloy material, such as a metal single-layer structure or a metal multi-layer structure formed of molybdenum, aluminum, titanium, etc., for example, the multi-layer structure is a multi-metal stacked layer (such as a three-layer metal stacked layer of titanium, aluminum, and titanium (Ti/Al/Ti)). The embodiments of the present disclosure are not specifically limited to the material of each functional layer.

As shown in FIGS. 3, 4, 5, and 7, the plurality of signal lines, the first power line VGH, and the second power line VGL are connected to transistors and capacitors in the remaining layers that need to be connected to the plurality of signal lines, the first power line VGH, and the second power line VGL through at least one hole shown in FIG. 6, and the respective transistors and the respective capacitors are also connected through at least one hole or are bridged through transfer electrodes, which will not be repeated here.

FIG. 2 is a schematic diagram of the stacking position relationship of the semiconductor layer 310 shown in FIG. 3, the first conductive layer 320 shown in FIG. 4, the second conductive layer 330 shown in FIG. 5, and the third conductive layer 340 shown in FIG. 7 and the connection relationship through a plurality of holes shown in FIG. 6.

As shown in FIG. 2, the gate electrode G2 of the first control transistor T2 (as shown in FIG. 4), the first electrode SD71 of the first noise reduction transistor T7 (as shown in FIG. 7), and the first electrode SD81 of the voltage stabilizing transistor T8 (as shown in FIG. 7) are connected to the first node N1, the first electrode SD71 of the first noise reduction transistor T7 (as shown in FIG. 7) and the first electrode SD81 of the voltage stabilizing transistor T8 (as shown in FIG. 7) are both located on the first source-drain electrode layer, and the first source-drain electrode layer includes the first transfer electrode E1 (as shown in FIG. 7), that is, the first electrode SD71 of the first noise reduction transistor T7 (as shown in FIG. 7), the first electrode SD81 of the voltage stabilizing transistor T8 (as shown in FIG. 7), and the first transfer electrode E1 (as shown in FIG. 7) are located in a continuous first source-drain electrode layer and are integrally formed, thereby reducing the number of wiring lines and increasing the space occupancy rate of the display substrate.

For example, as shown in FIG. 3, FIG. 6, and FIG. 7, the first electrode SD71 of the first noise reduction transistor T7 is connected to the active layer A7 of the first noise reduction transistor T7 through a hole H71 penetrating through the first insulation layer 350, the second insulation layer 360, and the third insulation layer 370. The first electrode SD81 of the voltage stabilizing transistor T8 is connected to the active layer A8 of the voltage stabilizing transistor T8 through a hole H81 penetrating through the first insulation layer 350, the second insulation layer 360, and the third insulation layer 370.

For example, as shown in FIG. 7, the first source-drain electrode layer is located on the third conductive layer 340 of the display substrate.

For example, as shown in FIG. 7, the first transfer electrode E1 includes a first portion E11 extending in parallel along a second direction Y that is different from the first direction X, and a second portion E12 formed integrally with the first portion and extending along the first direction, a first end of the first portion E11 is connected to the first electrode SD71 of the first noise reduction transistor T7, and a second end of the first portion E11 is connected to the first electrode SD81 of the voltage stabilizing transistor T8, and the second portion E12 is connected to the gate electrode G2 of the first control transistor T2 which is not in the same layer as the second portion E12 (as shown in FIG. 4). It should be noted that the position of the first end of the first portion E11 and the position of the first electrode SD71 of the first noise reduction transistor T7 are regarded as the same, that is, are integrally formed. Therefore, the label of the first end of the first portion E11 is not shown in FIG. 7, and similarly, the label of the second end of the first portion E11 is not shown in FIG. 7.

For example, as shown in FIG. 4, FIG. 6, and FIG. 7, the second portion E12 of the first transfer electrode E1 is connected to the gate electrode G2 of the first control transistor T2 through a hole GH1 penetrating through the second insulation layer 360 and the third insulation layer 370.

For example, as shown in FIGS. 2 and 7, the first transfer electrode E1 is polygonal lines that are located among the first noise reduction transistor T7, the voltage stabilizing transistor T8, and the first control transistor T2, and extend along the first direction X and the second direction Y, one end of the first portion E11 (that is, the first end of the first portion E11), which extends along the second direction Y, of the first transfer electrode E1 is the first electrode SD71 of the first noise reduction transistor T7, the other end of the first portion E11, which extends along the second direction Y (that is, the second end of the first portion E11) of the first transfer electrode E1 is the first electrode SD81 of the voltage stabilizing transistor T8. The second portion E12 of the first transfer electrode E1 extending along the first direction X is drawn from the first portion of the first transfer electrode E1, and the second portion of the first transfer electrode E1 is connected to the gate electrode of the first control transistor T2, so that the first portion E11 and the second portion E12 form a shape similar to an inverted "T" shape. The first electrode SD71 of the first noise reduction transistor T7 and the first electrode SD81 of the voltage stabilizing transistor T8 are connected through the first portion E11 of the first transfer electrode E1 extending along the second direction Y, and the second portion E12 of the first transfer electrode E1 is connected to the gate electrode G2 of the first control transistor T2, which can reduce the number of transfer electrodes and the complexity of wiring, improve the space utilization rate of the display substrate, and also reduce the generation of parasitic capacitance of the display substrate. As shown in FIG. 2, the first transfer electrode E1 enables a distance between the first electrode SD71 of the first noise reduction transistor T7 and the first electrode SD81 of the voltage stabilizing transistor T8 in the second direction Y to be relatively long, thereby reducing the generation of the parasitic capacitance (such as spatial parasitic capacitance). The first transfer electrode E1 enables the gate electrode of the first control transistor T2 to be away from the first noise reduction transistor T7 and the voltage stabilizing transistor T8 in the first direction X to reduce the generation of the parasitic capacitance (such as space parasitic capacitance).

For example, in other embodiments, as shown in FIGS. 2 and 7, the position of the voltage stabilizing transistor T8 can also be moved to a direction close to the first noise reduction transistor T7, if necessary, the length of the output transistor T5 in the second direction Y can be reduced, so that the first electrode SD81 of the voltage stabilizing transistor T8 and the second portion E12 of the first transfer electrode E1 are located on a straight line along the first direction X, in this case, the second portion E12 and the first portion E11 of the first transfer electrode E1 can be formed in a shape similar to "L" shape, which can also reduce the number of transfer electrodes and the complexity of wiring, and improve the space utilization rate of the display substrate. However, the distances between the voltage stabilizing transistor T8 as well as the first noise reduction transistor T7 and the output transistor T5 are reduced. Compared with the structure shown in FIG. 2, the spatial parasitic capacitance between the voltage stabilizing transistor T8 as well as the first noise reduction transistor T7 and the output transistor T5 may be increased. The first transfer electrode E1 of the embodiments of the present disclosure is not limited to the inverted "T" shaped structure as shown in FIG. 2.

For example, the included angle between the first direction and the second direction is between 70° and 90°, and includes 70° and 90°. For example, the included angle between the first direction and the second direction is 70°, 90°, or 80°, etc., can be set according to actual conditions, and the embodiments of the present disclosure are not limited to this case. For example, the included angle between the first direction and the second direction may also be 75°, 85°, and so on.

For example, as shown in FIG. 3, an orthographic projection of the active layer A7 of the first noise reduction transistor T7 on the base substrate 101 is located on a side of an orthographic projection of the active layer A2 of the first control transistor T2 on the base substrate 101 close to the display region 102, that is, in the first direction Y, the active layer A7 of the first noise reduction transistor T7 is located on the right side of the active layer A2 of the first control transistor T2. For example, an orthographic projection of the active layer A8 of the voltage stabilizing transistor T8 on the base substrate 101 is located on a side of an orthographic projection of the active layer A2 of the first control transistor T2 on the base substrate 101 away from the display region 102, that is, in the first direction Y, the active layer A8 of the voltage stabilizing transistor T8 is located on the left side of the active layer A2 of the first control transistor T2. As a result, the wiring complexity of the first transfer electrode E1 can be reduced, the space utilization rate of the display substrate can be improved, and the overlap between the first transfer electrode E1 and other wiring lines can be reduced.

For example, in other embodiments, the orthographic projection of the active layer A8 of the voltage stabilizing transistor T8 on the base substrate 101 may also be located between the orthographic projection of the active layer A2 of the first control transistor T2 on the base substrate 101 and the orthographic projection of the active layer A7 of the first noise reduction transistor T7 on the base substrate 101, and the embodiments of the present disclosure are not limited thereto.

For example, as shown in FIG. 7, the first transfer electrode E1 further includes a third portion E13 extending in parallel along the second direction Y. The third portion E13 is connected to the second portion E12 (that is, the third portion E13 extends from the second portion E12 along the second direction Y to a direction close to the input transistor T1), the third portion E13 and the first portion E11 are arranged side by side in the first direction. The first electrode SD11 of the input transistor T1 is connected to an end of the third portion E13. It should be noted that the position of the end of the third portion E13 and the position of the first electrode SD11 of the input transistor T1 are considered to be the same, that is, are integrally formed, so that the label of the end of the third portion E13 is not shown in FIG. 7.

For example, the third portion E13 of the first transfer electrode E1 may not be parallel to the second direction Y. For example, the third portion E13 of the first transfer electrode E1 intersects the second direction Y at a certain angle. For example, the intersection angle is less than or equal to 20°.

For example, in other embodiments, as shown in FIG. 2 and FIG. 7, the input transistor T1 can also be moved to a direction close to the first control transistor T2, the first electrode SD11 of the input transistor T1 and the second portion E12 of the first transfer electrode E1 are located on a straight line along the first direction X, in this case, the first electrode SD11 of the input transistor T1 can be directly connected to the second portion E12 of the first transfer electrode E1, without the need to design the third portion E13 of the first transfer electrode E1, the wiring complexity of the first transfer electrode E1 can also be reduced, the space utilization rate of the display substrate can be improved, and the overlap between the first transfer electrode E1 and other wiring lines can be reduced. However, in the case where the distances between the input transistor T1 and the first control transistor T2 as well as the second control transistor T3 are reduced, compared to the structure shown in FIG. 2, the space parasitic capacitance between the input transistor T1 and the first control transistor T2 as well as the second control transistor T3.

For example, as shown in FIG. 3, FIG. 6, and FIG. 7, the first electrode SD11 of the input transistor T1 is connected to the active layer A1 of the input transistor T1 through a hole H11 penetrating through the first insulation layer 350, the second insulation layer 360, and the third insulation layer 370.

For example, as shown in FIG. 3, an orthographic projection of the active layer A1 of the input transistor T1 on the base substrate 101 is located between an orthographic projection of the active layer A2 of the first control transistor T2 on the base substrate 101 and an orthographic projection of the active layer A7 of the first noise reduction transistor T7 on the base substrate 101, that is, in the second direction Y, the active layer A1 of the input transistor T1 is located between the active layer A2 of the first control transistor T2 and the active layer A7 of the first noise reduction transistor T7. As a result, the overlap between the third portion E13 of the first transfer electrode E1 and other wiring lines is reduced, and the wiring complexity is reduced, so that the wiring of the shift register unit is more compact to save space, and the generation of parasitic capacitance is reduced.

For example, as shown in FIG. 2 and FIG. 7, the first transfer electrode E1 includes a first node N1. For example, the first transfer electrode E1 is implemented as the first node N1, which is used to connect the first electrode SD71, the first electrode SD71 of the first noise reduction transistor T7, the first electrode SD81 of the voltage stabilizing transistor T8, and the gate electrode G2 of the first control transistor T2 (as shown in FIG. 4). For example, the first transfer electrode E1 is located on the third conductive layer 340.

For example, as shown in FIG. 2 and FIG. 7, the display substrate further includes a second transfer electrode E2. The second transfer electrode E2 includes a first portion E21 extending along the first direction X and a second portion E22 parallel to the second direction Y. The second portion E22 extends from the first portion E21, and the second portion E22 and the first portion E21 form a shape similar to a "L" shape, so that the end of the first portion E21 of the second transfer electrode E2 is connected to the first electrode SD31 of the second control transistor T3, the second portion E22 of the second transfer electrode E2 is connected to the first electrode SD21 of the first control transistor T2. The second transfer electrode E2 may be arranged to not overlap with other wiring lines, so as to reduce the generation of parasitic capacitance. It should be noted that the position of the end of the first portion E21 and the position of the first electrode SD31 of the second control transistor T3 are regarded as the same, that is, are integrally formed, so that the label of the end of the first portion E21 is not shown in FIG. 7.

For example, the second portion E22 of the second transfer electrode E2 may not be parallel to the second direction Y, for example, the second portion E22 of the second transfer electrode E2 intersects the second direction Y at a certain angle. For example, the intersection angle is less than or equal to 20°.

For example, as shown in FIG. 3, FIG. 6, and FIG. 7, the first electrode SD31 of the second control transistor T3 is connected to the active layer A3 of the second control transistor T3 through a hole H31 penetrating through the first insulation layer 350, the second insulation layer 360, and the third insulation layer 370. The first electrode SD21 of the first control transistor T2 is connected to the active layer A2 of the first control transistor T2 through a hole H21 penetrating through the first insulation layer 350, the second insulation layer 360, and the third insulation layer 370.

For example, as shown in FIG. 2 and FIG. 7, the second transfer electrode E2 includes a second node N2. For example, the second transfer electrode E2 is implemented as the second node N2, which is used for connecting the first electrode SD31 of the second control transistor T3. For example, the second transfer electrode E2 is located on the third conductive layer 340.

For example, as shown in FIG. 3, an orthographic projection of the active layer A3 of the second control transistor T3 on the base substrate 101 is located on a side of an orthographic projection of the active layer A2 of the first control transistor T2 on the base substrate 101 away from the display region 101, that is, in the second direction Y, the active layer A3 of the second control transistor T3 is located on the left side of the active layer A2 of the first control transistor T2. As a result, the wiring complexity of the second transfer electrode E2 can be reduced, the space utilization rate of the display substrate can be improved, and the overlap between the second transfer electrode E2 and other wiring lines can be reduced.

For example, as shown in FIG. 3, the active layer A6 of the second noise reduction transistor T6 and the active layer A7 of the first noise reduction transistor T7 are located on a continuous first semiconductor layer, and the first semiconductor layer extends along the first direction, that is, the active layer A6 of the second noise reduction transistor T6 and the active layer A7 of the first noise reduction transistor T7 are integrally formed. For example, as shown in FIG. 2 and FIG. 3, the active layer A6 of the second noise reduction transistor T6 may also be staggered from the active layer A7 of the first noise reduction transistor T7 by a certain distance in the first direction, as long as it does not affect the arrangement of other structures and excessively increase the width of the shift register unit, and the embodiments of the present disclosure are not limited to this case.

For example, as shown in FIGS. 2 and 4, the gate electrode G6 of the second noise reduction transistor T6 and the gate electrode G7 of the first noise reduction transistor T7 extend along the second direction Y and are arranged side by side along the first direction X. For example, the gate electrode G6 of the second noise reduction transistor T6 and the gate electrode G7 of the first noise reduction transistor T7 may be parallel to each other, for example, both extend along the second direction Y, it is also possible that an extension direction of the gate electrode G6 of the second noise reduction transistor T6 and an extension direction of the gate electrode G7 of the first noise reduction transistor T7 are not parallel, for example, intersect at a certain angle, for example, the intersection angle is less than or equal to 20°, or the angle between each of the two extension directions and a horizontal line is less than or equal to 20°, the embodiments of the present disclosure are not limited to this case, as long as the second noise reduction transistor T6 and the first noise reduction transistor T7 are integrally arranged in a structure arranged up and down.

For example, as shown in FIG. 4, the display substrate further comprises a first connection wiring line L1 and a second connection wiring line L2 extending along the second direction Y, the first connection wiring line L1 and the second connection wiring line L2 are arranged in parallel, and the first connection wiring line L1 and the second connection wiring line L2 overlap the first transfer electrode E1 (as shown in FIG. 7), respectively. A first end L11 of the first connection wiring line L1 is connected to the gate electrode G6 of the second noise reduction transistor T6, and a second end L12 of the first connection wiring line L1 is connected to an end E221 of the second portion E22 of the second transfer electrode E2 that is not in the same layer as the first connection wiring line L1. A first end L21 of the second connection wiring line L2 is connected to the gate electrode G7 of the first noise reduction transistor T7, and a second end L22 of the second connection wiring line L2 is connected to the second clock signal line GCB to receive the second clock signal. Therefore, both the first connection wiring line L1 and the second connection wiring line L2 are straight line structures without bending, which can enable the wiring structure of the display substrate more concise and save wiring space.

For example, in other embodiments, extension directions of the first connection wiring line L1 and the second connection wiring line L2 may not be parallel, for example, the first connection wiring line L1 and the second connection wiring line L2 intersect at a certain angle. For example, the intersection angle is less than or equal to 20°, or the angle between each of the two extension directions and the horizontal line is less than or equal to 20°.

For example, as shown in FIG. 4, FIG. 6, and FIG. 7, the second end L12 of the first connection wiring line L1 is connected to the end E221 of the second portion E22 of the second transfer electrode E2 through a hole GH2 penetrating through the second insulation layer 360 and the third insulation layer 370. The second end L22 of the second connection wiring line L2 is connected to the second clock signal line GCB through a hole GH7 penetrating through the second insulation layer 360 and the third insulation layer 370.

For example, as shown in FIG. 2, the gate electrode G8 of the voltage stabilizing transistor T8 is connected to the second power line VGL to receive the second voltage. For example, as shown in FIGS. 4, 6, and 7, the gate electrode G8 of the voltage stabilizing transistor T8 is connected to the second power line VGL through a hole GH8 penetrating through the second insulation layer 360 and the third insulation layer 370.

For example, as shown in FIG. 7, the second power line VGL includes a protrusion portion E01 protruding in the second direction Y. For example, the second power line VGL and the protrusion portion E01 are integrally formed, and the protrusion portion E01 is located on the third conductive layer 340. The second electrode SD32 of the second control transistor T3 is connected to the protrusion portion E01 on the second power line VGL to receive the second voltage. For example, the protrusion portion E01 on the second power line VGL is integrally formed with the second electrode SD32 of the second control transistor T3. For another example, the protrusion portion E01 on the second power line VGL serves as the second electrode SD32 of the second control transistor T3. For example, as shown in FIG. 3, FIG. 6, and FIG. 7, the second electrode SD32 of the second control transistor T3 is connected to the active layer A3 of the second control transistor T3 through a hole H32 penetrating through the first insulation layer 350, the second insulation layer 360, and the third insulation layer 370.

For example, as shown in FIG. 4, the gate electrode G1 of the input transistor T1 includes a first gate electrode G11 and a second gate electrode G12 that are arranged in parallel to form a double-gate structure having a shape like "U", so that input transistor T1 is fully turned off in the case where it is turned off, thereby reducing leakage. In this case, the active layer A1 of the input transistor T1 extends along the first direction X and is in a strip shape (as shown in FIG. 3), the first gate electrode G11 and the second gate electrode G12 of the input transistor T1 are connected to the gate electrode G3 of the second control transistor T3. The gate electrode G3 of the second control transistor T3 is also connected to the first clock signal line GCK to provide the first clock signal to the gate electrode G3 of the second control transistor T3 and the first gate electrode G11 and the second gate electrode G12 of the input transistor T1. As a result, the tightness of wiring is increased and wiring space is saved. Of course, the gate electrode of the input transistor T1 may also only include a single gate electrode that overlaps the active layer of the input transistor T1, and the embodiments of the present disclosure are not limited to this case.

For example, the structure of the active layer A1 of the input transistor T1 can also be interchanged with the structure of the gate electrode G1 of the input transistor T1, so that the input transistor T1 can also form a double-gate structure. For example, the active layer A1 has a structure similar to a "U" shape, and the gate electrode G1 is in a strip shape along the second direction Y.

For example, as shown in FIGS. 4, 6, and 7, the gate electrode G3 of the second control transistor T3 is connected to the first clock signal line GCK through a hole GH6 penetrating through the second insulation layer 360 and the third insulation layer 370.

For example, as shown in FIG. 7, the display substrate further includes a third transfer electrode E3. The third transfer electrode E3 extends along the first direction X, a first end E31 of the third transfer electrode E3 is connected to the gate electrode G3 of the second control transistor T3 (as shown in FIG. 4) and the first gate G11 electrode and the second gate electrode G12 of the input transistor T1. A second end of the third transfer electrode E3 and the second electrode SD22 of the first control transistor T2 are connected to each other and are formed integrally. Because in the first direction X, the second electrode SD22 of the first control transistor T2 is adjacent to the gate electrode G3 of the second control transistor T3 (as shown in FIG. 4), the length of the third transfer electrode E3 is shorter than that of other transfer electrodes (for example, the first transfer electrode E1 and the second transfer electrode E2). As a result, the tightness of the wiring of the display substrate is increased, the space occupied by the third transfer electrode E3 and the overlap between the third transfer electrode E3 and other wiring lines are reduced, and the wiring complexity of the display substrate is reduced. It should be noted that the position of the second end of the third transfer electrode E3 and the position of the second electrode SD22 of the first control transistor T2 are regarded as the same, that is, are integrally formed, and the second end of the third transfer electrode E3 and the second electrode SD22 of the first control transistor T2 are not labeled in the figure.

For example, the third transfer electrode E3 may not be parallel to the first direction X, for example, the third transfer electrode E3 intersects the first direction X at a certain angle. For example, the intersection angle is less than or equal to 20°.

For example, as shown in FIG. 4, FIG. 6, and FIG. 7, the first end E31 of the third transfer electrode E3 is connected to the gate electrode G3 of the second control transistor T3 and the first gate electrode G11 and the second gate electrode G12 of the input transistor through a hole GH3 penetrating through the second insulation layer 360 and the third insulation layer 370.

For example, as shown in FIGS. 3, 6, and 7, the second electrode SD22 of the first control transistor T2 is connected to the active layer A2 of the first control transistor T2 through a hole H22 penetrating through the first insulation layer 350, the second insulation layer 360, and the third insulation layer 370.

For example, as shown in FIGS. 2 and 3, an orthographic projection of the first capacitor C1 on the base substrate 101 is located on a side of an orthographic projection of the active layer A4 of the output control transistor T4 on the base substrate 101 close to the display region 102, the orthographic projection of the first capacitor C1 on the base substrate 101 and the orthographic projection of the first power line VGH on the base substrate 101 at least partially overlap. That is, in the second direction Y, the first capacitor C1 is located on the right side of the output control transistor T4, so that the first capacitor C1 is closer to the display region to leave more space in the shift register unit 104 for other elements, such as transistors, transfer electrodes, power lines, etc., so as to reduce the overlap among the wiring lines. Therefore, the space occupied by the first capacitor C1 is reduced.

For example, in other embodiments, in a case where the design space of the shift register unit permits, the orthographic projection of the first capacitor C1 on the base substrate 101 and the orthographic projection of the first power line VGH on the base substrate 101 may not overlap. It should be noted that in the case where the orthographic projection of the first capacitor C1 on the base substrate 101 and the orthographic projection of the first power line VGH on the base substrate 101 at least partially overlap, the normal operation of the first capacitor C1 will not be affected.

For example, as shown in FIG. 2, the shape of the first capacitor C1 is a rectangle. As shown in FIG. 4 and FIG. 5, both the first electrode CE11 and the second electrode CE12 of the first capacitor C1 are rectangular. The second insulation layer 360 is provided between the first electrode CE11 and the second electrode CE12.

For example, as shown in FIGS. 4, 6, and 7, the first electrode CE11 of the first capacitor C1 is connected to the gate electrode G4 of the output control transistor T4. For example, the first electrode CE11 of the first capacitor C1 and the gate electrode G4 of the output control transistor T4 may be integrally formed. The second electrode CE12 of the first capacitor C1 is connected to the first power line VGH through a hole GH9 penetrating through the third insulation layer 370.

For example, in other examples, the second electrode CE12 of the first capacitor C1 may also be located on the third conductive layer 340. In this case, the second insulation layer 360 and the third insulation layer 370 are provided between the first electrode CE11 and the second electrode CE12.

For another example, in other examples, the first electrode CE11 of the first capacitor C1 may also be located on the first conductive layer 320. In this case, the first insulation layer 350 and the second insulation layer 360 are provided between the first electrode CE11 and the second electrode CE12.

For example, as shown in FIG. 7, the display substrate further includes a fourth transfer electrode E4. The fourth transfer electrode E4 is connected to the first electrode SD61 of the second noise reduction transistor T6 and the first electrode SD41 of the output control transistor T4. For example, the fourth transfer electrode E4 extends from the first electrode SD61 of the second noise reduction transistor T6 along the first direction X to the direction close to the output control transistor T4, and then is bent to the second direction Y, so as to be connected to the first electrode SD41 of the output control transistor T4, thereby reducing the wiring complexity and the occupied space.

For example, as shown in FIG. 4, the gate electrode G6 of the second noise reduction transistor T6 and the gate electrode G4 of the output control transistor T4 are connected to each other and are integrally formed. For example, a connection wiring line between the gate electrode G6 of the second noise reduction transistor T6 and the gate electrode G4 of the output control transistor T4 extends from the gate electrode G6 of the second noise reduction transistor T6 along the first direction X to a direction close to the output control transistor, and then is bent to the second direction Y, so as to be connected to the gate electrode G4 of the output control transistor T4. An orthographic projection of the connection wiring line between the gate electrode G6 of the second noise reduction transistor T6 and the gate electrode G4 of the output control transistor T4 on the base substrate does not overlap with an orthographic projection of the fourth transfer electrode E4 (as shown in FIG. 7) on the base substrate. As a result, the overlap between the connection wiring line between the second noise reduction transistor T6 and the output control transistor T4 and other wiring lines is reduced, thereby reducing the wiring complexity and increasing the space utilization rate.

For example, as shown in FIG. 2 and FIG. 7, the fourth transfer electrode E4 also includes the second node N2. The fourth transfer electrode E4 is used to connect the first electrode SD61 of the second noise reduction transistor T6 and the first electrode SD41 of the output control transistor T4. The fourth transfer electrode E4 is located on the third conductive layer 340.

For example, as shown in FIG. 3, FIG. 6, and FIG. 7, the first electrode SD61 of the second noise reduction transistor T6 is connected to the active layer A6 of the second noise reduction transistor T6 through a hole H61 penetrating through the first insulation layer 350, the second insulation layer 360, and the third insulation layer 370. The first electrode SD41 of the output control transistor T4 is connected to the active layer A4 of the output control transistor T4 through a hole H41 penetrating through the first insulation layer 350, the second insulation layer 360, and the third insulation layer 370.

For example, as shown in FIG. 2, an orthographic projection of the second capacitor C2 on the base substrate 101 is located between an orthographic projection of the first power line VGH on the base substrate 101 and orthographic projections of the active layer A4 of the output control transistor T4 (as shown in FIG. 3) and the active layer A5 of the output transistor T5 (as shown in FIG. 3) on the base substrate 101. So that the second capacitor C2 is closer to the display region, so as to leave more space in the shift register unit 104 for other elements, such as transistors, transfer electrodes, power lines, etc., so as to reduce the overlap among the wiring lines.

For example, as shown in FIG. 4, the first electrode CE21 of the second capacitor C2 is connected to the gate electrode G5 of the output transistor T5. For example, the first electrode CE21 of the second capacitor C2 and the gate electrode G5 of the output transistor T5 may be integrally formed.

For example, as shown in FIG. 2, the shape of the second capacitor C2 is a rectangle. For example, as shown in FIGS. 4 and 5, both the first electrode CE21 and the second electrode CE22 of the second capacitor C2 are rectangular. The second insulation layer 360 is provided between the first electrode CE21 and the second electrode CE22.

For example, in other examples, the second electrode CE22 of the second capacitor C2 may also be located on the third conductive layer 340. In this case, the second insulation layer 360 and the third insulation layer 370 are provided between the first electrode CE21 and the second electrode CE22.

For another example, in other examples, the first electrode CE21 of the second capacitor C2 may also be located on the first conductive layer 320. In this case, the first insulation layer 350 and the second insulation layer 360 are provided between the first electrode CE21 and the second electrode CE22.

For example, as shown in FIGS. 4 and 7, the display substrate further includes a fifth transfer electrode E5. The first electrode SD51 of the output transistor T5 is connected to a first end E51 of the fifth transfer electrode E5, and the gate electrode G7 of the first noise reduction transistor T7 is connected to the fifth transfer electrode E5. For example, an orthographic projection of the fifth transfer electrode E5 on the base substrate 101 does not overlap with the orthographic projection of the first transfer electrode E1 and the orthographic projection of the fourth transfer electrode E4 on the base substrate 101, so that the fifth transfer electrode E5 does not overlap with other wiring lines, thereby reducing the wiring complexity and increasing the space utilization rate.

For example, as shown in FIG. 3, FIG. 6, and FIG. 7, the first electrode SD51 of the output transistor T5 is connected to the active layer A5 of the output transistor T5 through a hole H51 penetrating through the first insulation layer 350, the second insulation layer 360, and the third insulation layer 370.

For example, as shown in FIGS. 4, 6, and 7, the gate electrode G7 of the first noise reduction transistor T7 is connected to the fifth transfer electrode E5 through a hole GH4 penetrating through the second insulation layer 360 and the third insulation layer 370.

For example, as shown in FIG. 7, the display substrate further includes a sixth transfer electrode E6 extending in parallel along the second direction Y. The gate electrode G5 of the output transistor T5 is connected to a first end E61 of the sixth transfer electrode E6, and a second end of the sixth transfer electrode E6 is connected to the second electrode SD82 of the voltage stabilizing transistor T8. For example, an orthographic projection of the sixth transfer electrode E6 on the base substrate 101 does not overlap with the orthographic projection of the first transfer electrode E1 on the base substrate 101. As a result, the space occupied by the sixth transfer electrode E6 and the overlap between the sixth transfer electrode E6 and other wiring lines are reduced, and the generation of parasitic capacitance is reduced. It should be noted that the position of the second end of the sixth transfer electrode E6 and the position of the second electrode SD82 of the voltage stabilizing transistor T8 are regarded as the same and are formed integrally, and the second end of the sixth transfer electrode E6 and the second electrode SD82 of the voltage stabilizing transistor T8 are not labeled in the figure.

For example, the sixth transfer electrode E6 may not be parallel to the second direction Y, for example, the sixth transfer electrode E6 intersects the second direction Y at a certain angle. For example, the intersection angle is less than or equal to 20°.

For example, as shown in FIGS. 4, 6, and 7, the gate electrode G5 of the output transistor T5 is connected to the first end E61 of the sixth transfer electrode E6 through a hole GH5 penetrating through the second insulation layer 360 and the third insulation layer 370.

For example, as shown in FIG. 3, FIG. 6, and FIG. 7, the second electrode SD82 of the voltage stabilizing transistor T8 is connected to the active layer A8 of the voltage stabilizing transistor T8 through a hole H82 penetrating through the first insulation layer 350, the second insulation layer 360, and the third insulation layer 370.

For example, as shown in FIG. 2 and FIG. 7, the sixth transfer electrode E6 includes a third node N3. For example, the sixth transfer electrode E6 is implemented as the third node N3 for connecting the second electrode SD82 of the voltage stabilizing transistor T8 and the gate electrode G5 of the output transistor T5 (shown in FIG. 4). The sixth transfer electrode E6 is located on the third conductive layer 340.

For example, as shown in FIG. 7, the display substrate further includes a seventh transfer electrode E7, a first end E71 of the seventh transfer electrode E7 is connected to the second electrode SD42 of the output control transistor T4, and a second end E72 of the seventh transfer electrode E7 is connected to the second electrode SD52 of the output transistor T5. For example, the seventh transfer electrode E7 extends along the first direction X. For example, an orthographic projection of the seventh transfer electrode E7 on the base substrate is located between the orthographic projection of the first power line VGH on the base substrate and the orthographic projections of the active layer A4 of the output control transistor T4 (as shown in FIG. 3) and the active layer A5 of the output transistor T5 (as shown in FIG. 3) on the base substrate. As a result, the space occupied by the seventh transfer electrode E7 and the overlap between the seventh transfer electrode E7 and other wiring lines are reduced, thereby reducing the generation of parasitic capacitance and reducing the wiring complexity of the display substrate.

For example, as shown in FIG. 4, FIG. 6, and FIG. 7, the seventh transfer electrode E7 is connected to the second electrode CE22 of the second capacitor C2 through a hole GH10 penetrating through the third insulation layer 370.

For example, as shown in FIGS. 3, 6, and 7, the second electrode SD42 of the output control transistor T4 is connected to the active layer A4 of the output control transistor T4 through a hole H42 penetrating through the first insulation layer 350, the second insulation layer 360, and the third insulation layer 370. The second electrode SD52 of the output transistor T5 is connected to the active layer A5 of the output transistor T5 through a hole H52 penetrating through the first insulation layer 350, the second insulation layer 360, and the third insulation layer 370.

For example, as shown in FIG. 7, the second electrode SD52 of the output transistor T5 is connected to the second electrode SD12 of the input transistor T1 of a next stage of shift register unit adjacent to the shift register unit 104, so as to take the output signal of the second electrode SD52 of the output transistor T5 as the input signal of the second electrode SD12 of the input transistor T1 of the next stage of shift register unit.

For example, as shown in FIG. 3, FIG. 6, and FIG. 7, the second electrode SD12 of the input transistor T1 is connected to the active layer A1 of the input transistor T1 through a hole H12 penetrating through the first insulation layer 350, the second insulation layer 360, and the third insulation layer 370.

For example, as shown in FIG. 4, FIG. 6, and FIG. 7, the second electrode SD12 of the input transistor T1 and the second electrode SD42 of the output control transistor T4 are connected to the output terminal GOUT of the shift register unit through the hole GH11 penetrating through the second insulation layer 360 and the third insulation layer 370 to output the output signal to the output terminal.

For example, as shown in FIG. 3, the active layer A4 of the output control transistor T4 and a part of the active layer A5 of the output transistor T5 (the part of the active layer A5 that is located in the same column as the active layer A4 in the first direction X) are located on a continuous second semiconductor layer, and the second semiconductor layer extends along the first direction X. The active layer A4 of the output control transistor T4 can also be staggered from the part of the active layer A5 of the output transistor T5 by a certain distance in the first direction, so long as it does not affect the arrangement of other structures and excessively increase the width of the shift register unit, and the embodiments of the present disclosure are not limited to this case.

For example, as shown in FIGS. 3 and 7, the active layer A5 of the output transistor T5 includes two portions, one portion of the two portions and the active layer A4 of the output control transistor T4 are located in a second semiconductor layer that is continuous and extends in the first direction X, the other portion of the two portions is located on a side of the active layer A4 of the output control transistor T4 close to the voltage stabilizing transistor T8 (for example, located below the active layer A7 of the first noise reduction transistor T7 in FIG. 3), in addition, lengths of a portion of the first electrode SD51 and a length of a portion of the second electrode SD52 (for example, the first electrode SD51 and the second electrode SD51 extending in the second direction Y and away from the output control transistor T4 in FIG. 7) of the output transistor T5 that are close to the voltage stabilizing transistor T8 are greater than a length of the first electrode SD51 and a length of the second electrode SD52 in other positions. Thus, the width of the output transistor T5 in the second direction Y can be increased to increase the output signal capability of the output transistor T5.

For example, in other embodiments, a portion of the active layer A5 of the output transistor T5 located on the side of the active layer A4 of the output control transistor T4 close to the voltage stabilizing transistor T8 (for example, located below the active layer A7 of the first noise reduction transistor T7 in FIG. 3) may extend in the direction close to the active layer A4 of the output control transistor T4, so as to be connected to another portion of the active layer A5. For example, as shown in FIG. 4, the gate electrode G4 of the output control transistor T4 and the gate electrode G5 of the output transistor T5 extend along the second direction Y and are arranged side by side in the first direction X. For example, the gate electrode G4 of the output control transistor T4 and the gate electrode G5 of the output transistor T5 may be parallel, for example, both extend in the second direction Y, the extension direction of the gate electrode G4 of the output control transistor T4 and the extension direction of the gate electrode G5 of the output transistor T5 may also be not parallel, for example, intersect at a certain angle, for example, the intersection angle is less than or equal to 20°, or the angle between each of the two extension directions and the horizontal line is less than or equal to 20°, and the embodiments of the present disclosure are not limited to this case, as long as the output control transistor T4 and the output transistor T5 are integrally arranged in a structure arranged up and down.

For example, as shown in FIG. 7, the first electrode SD41 of the output control transistor T4 is connected to the first power line VGH to receive the first voltage, so as to reduce the space occupied by the connection wiring line and the wiring complexity.

It should be noted that in the embodiments of the present disclosure, for example, the first transfer electrode E1, the second transfer electrode E2, the third transfer electrode E3, the fourth transfer electrode E4, the fifth transfer electrode E5, and the sixth transfer electrode E6, and the seventh transfer electrode E7 are all located on the third conductive layer 340. The first transfer electrode E1 is used to connect the electrode of the first noise reduction transistor T7, the electrode of the voltage stabilizing transistor T8, and the electrode of the first control transistor T2, and includes the first node N1. The second transfer electrode E2 is used to connect the electrode of the first control transistor T2 and the electrode of the second control transistor T3. The second transfer electrode E2 includes the second node N2. The third transfer electrode E3 is used to connect the electrode of the second control transistor T3, the electrode of the input transistor T1, and the electrode of the first control transistor T2. The fourth transfer electrode E4 is used to connect the electrode of the second noise reduction transistor T6 and the electrode of the output control transistor T4. The fifth transfer electrode E5 is used to connect the electrode of the first noise reduction transistor T7 and the electrode of the output transistor T5. The sixth transfer electrode E6 is used to connect the electrode of the output transistor T5 and the electrode of the voltage stabilizing transistor T8. The sixth transfer electrode E6 includes the third node N3. The seventh transfer electrode E7 is used to connect the electrode of the output transistor T5 and the electrode of the output control transistor T4. According to the needs of the wiring layout and the like in the shift register unit 104, without affecting the function of the circuit, the first transfer electrode E1, the second transfer electrode E2, the third transfer electrode E3, the fourth transfer electrode E4, the fifth transfer electrode E5, and the sixth transfer electrode E6, and the seventh transfer electrode E7 can also be arranged on other layers, for example, the seventh transfer electrode E7 is arranged on the second conductive layer 330.

For example, in some embodiments of the present disclosure, the line width of the wiring line of each layer is generally 3 micrometers, for example, and the spacing distance between the wiring lines on the same layer is, for example, greater than 3 micrometers. For example, the spacing distance between the wiring lines is related to the accuracy of the exposure machine, for example, the higher the accuracy of the exposure machine, the smaller the spacing distance can be, which can be specifically determined according to actual conditions, and the embodiments of the present disclosure are not limited to this case. In the embodiments of the present disclosure, a necessary spacing distance must be left between the wiring lines of the same layer to avoid the wiring adhesion and signal short-circuit in the actual process.

For example, as shown in FIG. 4, a spacing distance between an orthographic projection of each wiring line of the first conductive layer 320 on the base substrate 101 and an orthographic projection of each wiring line of the second conductive layer 330 on the base substrate 101 is generally, for example, 1.5 micrometers, for example, a gate electrode of a transistor in the first conductive layer 320 needs to exceed an active layer of the transistor on the semiconductor layer 310 by more than 2 micrometers, for example. For example, as shown in FIGS. 2, 3, and 4, the orthographic projections of the first gate electrode and the second gate electrode of the first transistor T1 on the base substrate 101 exceed, in the second direction Y, two sides the orthographic projection of the active layer A1 of the first transistor T1 on the base substrate 101, for example, by more than 2 micrometers, which is not limited in the embodiments of the present disclosure.

For example, as shown in FIGS. 3 to 5, a spacing distance between a orthographic projection of each active layer (for example, the active layer A1 to the active layer A8) of each transistor in the semiconductor layer 310 on the base substrate 10 and an orthographic projection of each connection wiring line in the first conductive layer 320 on the base substrate 101 is 1.5 micrometers or more, so as to avoid a channel effect between the connection wiring line and the active layer of each transistor in the semiconductor layer 310 from occurring. For example, the spacing distance between the orthographic projection of the semiconductor layer 310 on the base substrate 10 and the orthographic projection of the second conductive layer 330 on the base substrate 10 is not limited, and the orthographic projection of the semiconductor layer 310 on the base substrate 10 and the orthographic projection of the second conductive layer 330 on the base substrate 10 may be overlapped. For example, in some embodiments of the present disclosure, a certain spacing distance between wiring lines of different layers is reserved as much as possible (this spacing distance is smaller than the spacing distance between wiring lines in the same layer), thereby reducing unnecessary overlap and avoiding interference caused by excessive parasitic capacitance.

For example, as shown in FIG. 2 and FIG. 6, the holes of the input transistor T1 to the voltage stabilizing transistor T8 for connecting the source electrodes or the drain electrodes and the active layers, such as holes H11, H12 to holes H81, H82, in FIG. 6, there is a difference in the number of holes H11, H12 to holes H81, H82. There are a plurality of holes H41 and a plurality of holes H42 of the output control transistor T4 in the second direction Y (for example, 6, respectively, in FIG. 6), the holes H51 and the holes H52 of the output transistor T5 are arranged in a plurality of rows in the first direction X and several holes H51 and several holes H52 of the output transistor T5 are arranged in the second direction Y, as a result, the firmness and tightness of the connection between the source electrode or drain electrode and the active layer of the transistor can be increased, so as to reduce the probability of generating leakage current. For example, each of the first electrodes (such as SD11, SD21, and the like in FIG. 7) or the second electrodes (such as SD12, SD22, and the like in FIG. 7) of the input transistor T1, the first control transistor T2, the second control transistor T3, the first noise reduction transistor T7, and the second noise reduction transistor T6 is connected to the corresponding active layer (such as A1, A2, etc. in FIG. 3)

through a hole (such as H11, H12, etc.). For example, two holes H81 connect the drain region D8 of the voltage stabilizing transistor T8 (shown in FIG. 3) and the first electrode SD81 (shown in FIG. 7) of the voltage stabilizing transistor T8, and two holes H82 connect the source region S8 of the voltage stabilizing transistor T8 (shown in FIG. 3) and the second electrode SD82 (shown in FIG. 7) of the voltage stabilizing transistor T8, setting two holes H81 and two holes H82 can increase the firmness and tightness of the connection between the source electrode or drain electrode and the active layer of the transistor, so as to reduce the probability of generating leakage current. For example, the number of holes GH1-GH11 connecting the first conductive layer 320 and the third conductive layer 340 is also different, and the number of each of holes GH1-GH3 is one, the number of each selected from a group consisting of GH4-GH9 and GH11 is 2, and the number of GH10 is 6, for example, two holes GH4 connect the gate electrode G7 of the first noise reduction transistor T7 and the fifth transfer electrode E5, which can increase the firmness and tightness of the connection between the gate electrode G7 and the fifth transfer electrode E5, so as to reduce the probability of generating leakage current. That is, in a case where the arrangement space of the shift register unit permits, increasing the number of holes can increase the firmness and tightness of the connection among electrodes, so as to reduce the probability of generating leakage current.

It should be noted that the number of holes (for example, holes H11 and H12 to holes H81 and H82, and hole GH1 to hole GH11) shown in FIG. 3 can be changed according to the design requirements of the transistors and connection wiring lines of the shift register unit, and the embodiments of the present disclosure are not limited thereto.

For example, as shown in FIG. 6 and FIG. 7, the width of each wiring line of the third conductive layer 340 should cover the corresponding hole (for example, holes H11, H12 to holes H81, H82, and hole GH1 to Hole GH11), for example, the width may exceed the size of the hole (for example, the diameter of the hole) by more than 1 micron. For example, the size of the hole is 2.0 to 2.5 microns, and the width of each wiring line of the third conductive layer 340 that covers the hole is 4 to 5 microns. For example, the width of each of the wiring lines, which correspond to the holes (H41, H42, H51, H52), of the output control transistor T4 and the output transistor T5 exceeds the size of the hole by 1 micron above and below, for example, 4.0~4.5 micron, because the output control transistor T4 and the output transistor T5 correspond to more holes, the width of the wiring line in the third conductive layer 340 connecting other transistors only needs to meet the requirement of covering the hole by more than 1 micron at the position of the hole. For example, the width of the wiring line between the hole can be thinner.

For example, as shown in FIG. 7, the spacing distance between the first clock signal line GCK, the second clock signal line GCB, the first power line VGH, and the second power line VGL, and the like located on the third conductive layer 340 is 3 microns or more, in order to meet the driving capability requirement, the first clock signal line GCK and the second clock signal line GCB have a line width of 9 microns or more, the line width of the second power line VGL can be 6, 9, or 10 microns, the line width of the first power line VGH is, for example, 10 microns, and the second voltage provided by the second power line VGL is generally −7V, for example.

For example, in some examples, the thickness of the first conductive layer 320 and the thickness of the second conductive layer 330 are 200~300 angstroms, the thickness of the third conductive layer 340 is 5000~8000 angstroms, and the embodiments of the present disclosure are not limited to this case.

Figure 9:
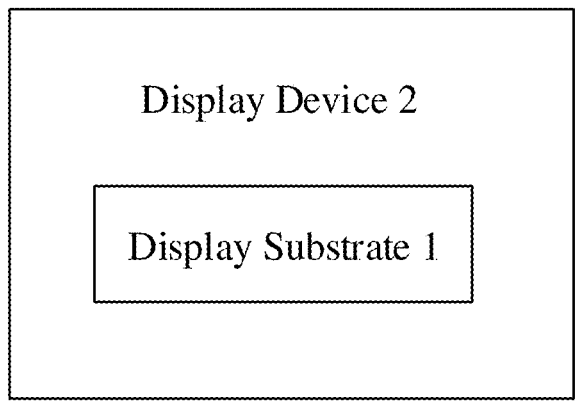
FIG. 9 is a schematic diagram of a display device provided by at least one embodiment of the present disclosure.

At least one embodiment of the present disclosure also provides a display device. FIG. 9 is a schematic diagram of a display device provided by at least one embodiment of the present disclosure. As shown in FIG. 9, the display device 2 includes a display substrate 1 provided by any embodiment of the present disclosure, for example, the display substrate 1 shown in FIG. 2.

It should be noted that the display device 2 can be any product or component with a display function, such as an OLED panel, an OLED TV, a QLED panel, a QLED TV, a mobile phone, a tablet computer, a notebook computer, a digital photo frame, a navigator, and the like. The display device 2 may also include other components, such as a data drive circuit, a timing controller, etc., and the embodiment of the present disclosure do not limit this.

It should be noted that, for the sake of clarity and conciseness, the embodiments of the present disclosure do not provide all the constituent units of the display device. In order to achieve the basic function of the display device, those skilled in the art can provide and set other structures not shown according to specific needs, which are not limited in the embodiments of the present disclosure.

Regarding the technical effect of the display device 2 provided by the above-mentioned embodiments, reference may be made to the technical effect of the display substrate 1 provided in the embodiments of the present disclosure, which will not be repeated here.

Figure 10:
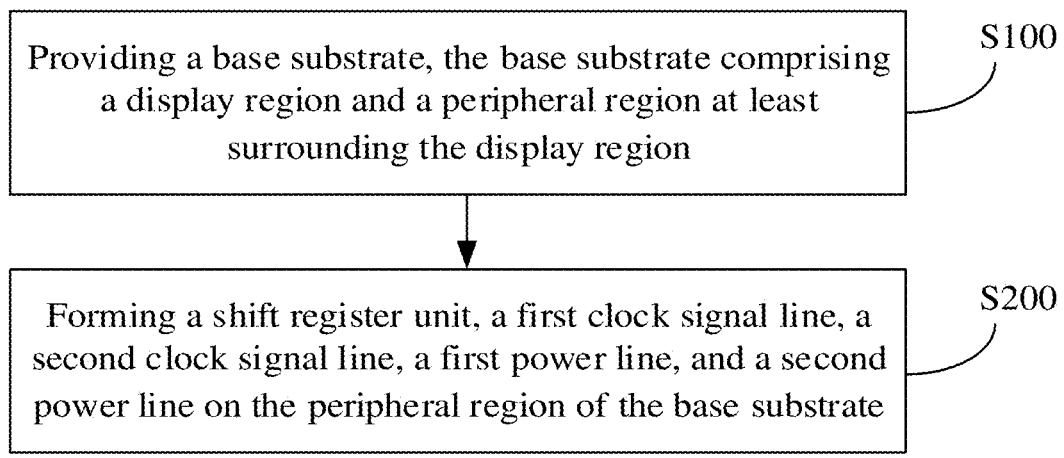
FIG. 10 is a flowchart of a manufacture method of a display substrate provided by at least one embodiment of the present disclosure.

At least one embodiment of the present disclosure also provides a manufacture method of a display substrate. FIG. 10 is a flowchart of a manufacture method of a display substrate provided by at least one embodiment of the present disclosure. For example, the manufacture method can be used to manufacture the display substrate provided by any embodiment of the present disclosure. For example, the manufacture method can be used to manufacture the display substrate shown in FIG. 2.

As shown in FIG. 10, the method of the display substrate includes step S100 to step S200.

Step S100: providing a base substrate, the base substrate comprising a display region and a peripheral region at least surrounding the display region.

Step S200: forming a shift register unit, a first clock signal line, a second clock signal line, a first power line, and a second power line on the peripheral region of the base substrate.

In step S100, for example, the base substrate 101 can be made of, for example, glass, plastic, quartz, or other suitable materials, and the embodiments of the present disclosure are not limited to this case. For example, an insulation material is deposited on the base substrate 101 to form the blocking layer 390 through a patterning process. For example, the insulation material may include inorganic insulation materials, such as silicon oxide, silicon nitride, and silicon oxynitride, and the patterning process includes: coating a photoresist layer on the insulation material, using a mask to expose the photoresist layer, developing the exposed photoresist layer to obtain a photoresist pattern, etching the insulation material using the photoresist pattern, and then optionally removing the photoresist pattern. For another example, an insulation material is deposited on the blocking layer 390 to form the buffer layer 3100 through a patterning process.

In step S200, forming the shift register unit, the first clock signal line, the second clock signal line, the first power line, and the second power line on the peripheral region of the base substrate, comprises: forming a semiconductor layer on the base substrate, and performing a patterning process on the semiconductor layer to form active layers (the active layer A1 and the active layer A8) of a plurality of transistors (input transistor T1 to voltage stabilizing transistor T8) of respective circuits of the shift register unit; forming a first insulation material layer on a side of the active layers of the plurality of transistors away from the base substrate, and performing a patterning process on the first insulation material layer to form a first insulation layer 350, and the first insulation layer comprising holes; forming a first conductive material layer on a side of the first insulation layer away from the base substrate, and performing a patterning process on the first conductive material layer to form gate electrodes (the gate electrode G1 to the gate electrode G8) of the plurality of transistors, a plurality of connection wiring lines (the first connection wiring line L1, the second connection wiring line L2), and first electrodes (the first electrode CE11 and the first electrode CE21) of a plurality of capacitors (the first capacitor C1 and the second capacitor C2) of the respective circuits (the input circuit 1041, the output circuit 1043, the first control circuit 1042, the output control circuit 1044, the second control circuit 1045, and the voltage stabilizing circuit 1046); forming a second insulation material layer on a side of the gate electrodes of the plurality of transistors away from the base substrate, and performing a patterning process on the second insulation material layer to form a second insulation layer 360, and the second insulation layer comprising holes; forming a second conductive material layer on a side of the second insulation layer away from the base substrate, and performing a patterning process on the second conductive material layer to form second electrodes (the second electrode CE12 and the second electrode CE22) of the plurality of capacitors; forming a third insulation material layer on a side of the second insulation layer and a side of the second electrodes of the plurality of capacitors away from the base substrate, and performing a patterning process on the third insulation material layer to form a third insulation layer 370, and the third insulation layer comprising holes; forming a third conductive material layer on a side of the third insulation layer away from the base substrate, and performing a patterning process on the third conductive material layer to form first electrodes (the first electrode SD11 to the first electrode SD81) and second electrodes (the second electrode SD12 and the second electrode SD82) of the plurality of transistors, a plurality of transfer electrodes (the first transfer electrode E1 to the seventh transfer electrode E7), the first clock signal line GCK, the second clock signal line GCB, the first power line VGH, and the second power line VGL.

For example, the material of the semiconductor layer may include polysilicon, oxide semiconductor (for example, indium gallium zinc oxide), or the like. The materials of the first insulation material, the second insulation material, and the third insulation material may include inorganic insulation materials such as silicon oxide, silicon nitride, and silicon oxynitride. The first conductive material, the second conductive material, and the third conductive material may include a metal material or an alloy material.

For example, the first electrodes and the second electrodes of respective transistors are connected to the active layers (the active layer A1 to the active layer A8) of the respective transistors through holes (for example, the hole H11, the hole H12 to the hole H81, and the hole H82) penetrating through the first insulation layer, the second insulation layer, and the third insulation layer. The respective transistors and the respective capacitors are connected to each other through a plurality of connection wiring lines or a plurality of transfer electrodes and through holes (for example, the hole GH1 to the hole GH11) penetrating through the second insulation layer and the third insulation layer, and are connected to the first clock signal line GCK, the second clock signal line GCB, the first power line VGH, and the second power line VGL.

For example, a fourth insulation material layer is formed on the side of the third conductive layer 340 away from the base substrate, and the fourth insulation layer 380 is formed through a patterning process. For example, the fourth insulation material may include inorganic insulation materials such as silicon oxide, silicon nitride, silicon oxynitride, or other suitable materials.

Regarding the arrangement of the connection structure of the respective transistors and capacitors of the shift register unit 104 with the first power line VGH, the second power line VGL, the plurality of clock signal lines, the connection wiring lines, and the transfer electrodes, reference may be made to the description of FIGS. 2-8, and similar portions will not be repeated here.

It should be noted that in a plurality of embodiments of the present disclosure, the flow of the manufacture method of the display substrate may include more or fewer operations, and these operations may be performed sequentially or in parallel. Although the flow of the manufacture method described above includes a plurality of operations in a specific order, it should be clearly understood that the order of the plurality of operations is not limited. The above-described manufacture method can be executed once, or executed several times according to predetermined conditions.

Regarding the technical effect of the manufacture method of the display substrate provided by the above embodiments, reference may be made to the technical effect of the display substrate provided in the embodiments of the present disclosure, and details are not described herein again.

The following should be noted:

(1) Only the structures involved in the embodiments of the present disclosure are illustrated in the drawings of the embodiments of the present disclosure, and other structures can refer to usual designs;

(2) The embodiments and features in the embodiments of the present disclosure may be combined in case of no conflict to acquire new embodiments.

What have been described above merely are exemplary embodiments of the present disclosure, and not intended to define the scope of the present disclosure, and the scope of the present disclosure is determined by the appended claims.

What is claimed is:

1. A display substrate, comprising:
a base substrate, comprising a display region and a peripheral region on at least one side of the display region; and
a shift register unit, a first clock signal line, and a second clock signal line, which are on the peripheral region of the base substrate,
wherein the first clock signal line and the second clock signal line extend along a first direction on the base substrate, and are configured to respectively provide a first clock signal and a second clock signal to the shift register unit, wherein the shift register unit comprises an input circuit, an output circuit, a first control circuit, a second control circuit, and a voltage stabilizing circuit, wherein the input circuit is configured to input an input signal to a first node in response to the first clock signal, wherein the first control circuit is connected to the first node and a second node, and is configured to control a level of the second node in response to a level of the first node and the first clock signal, wherein the second control circuit is connected to the first node and the second node, and is configured to control the level of the first node under control of the level of the second node and the second clock signal, wherein the voltage stabilizing circuit is connected to the first node and a third node, and is configured to stabilize a level of the third node, wherein the output circuit is connected to the third node, and is configured to output an output signal to an output terminal under control of the level of the third node, wherein the first control circuit comprises a first control transistor, the second control circuit comprises a first noise reduction transistor, the voltage stabilizing circuit comprises a voltage stabilizing transistor, a gate electrode of the first control transistor, a first electrode of the first noise reduction transistor, and a first electrode of the voltage stabilizing transistor are all connected to the first node, wherein the first electrode of the first noise reduction transistor and the first electrode of the voltage stabilizing transistor are in a first source-drain electrode layer, and the first source-drain electrode layer comprises a first transfer electrode, and wherein the first transfer electrode comprises a first portion extending in parallel along a second direction different from the first direction and a second portion integrally formed with the first portion and extending along the first direction, a first end of the first portion is connected to the first electrode of the first noise reduction transistor, a second end of the first portion is connected to the first electrode of the voltage stabilizing transistor, and the second portion is connected to the gate electrode of the first control transistor that is not in a same layer as the second portion.

2. The display substrate according to claim 1, wherein the first transfer electrode further comprises a third portion extending in parallel along the second direction, the third portion is connected to the second portion, and the third portion and the first portion are arranged side by side in the first direction, wherein the input circuit comprises an input transistor, and an orthographic projection of an active layer of the input transistor on the base substrate is between an orthographic projection of an active layer of the first control transistor on the base substrate and an orthographic projection of an active layer of the first noise reduction transistor on the base substrate, and wherein a first electrode of the input transistor is connected to an end of the third portion.

3. The display substrate according to claim 1, wherein the first transfer electrode comprises the first node.

4. The display substrate according to claim 1, further comprising a second transfer electrode, the first control circuit further comprising a second control transistor, wherein the second transfer electrode comprises a first portion and a second portion parallel to the second direction, and an end of the first portion of the second transfer electrode is connected to a first electrode of the second control transistor, and the second portion of the second transfer electrode is connected to a first electrode of the first control transistor, and wherein the second transfer electrode comprises the second node.

5. The display substrate according to claim 4, wherein an orthographic projection of an active layer of the second control transistor on the base substrate is on a side of an orthographic projection of an active layer of the first control transistor on the base substrate away from the display region.

6. The display substrate according to claim 4, wherein the second control circuit further comprises a second noise reduction transistor, wherein an active layer of the second noise reduction transistor and an active layer of the first noise reduction transistor are in a first semiconductor layer that is continuous, and the first semiconductor layer extends along the first direction, a gate electrode of the second noise reduction transistor and a gate electrode of the first noise reduction transistor extend along the second direction and are arranged side by side along the first direction, wherein the display substrate further comprises a first connection wiring line and a second connection wiring line extending along the second direction, the first connection wiring line and the second connection wiring line are arranged in parallel, and the first connection wiring line and the second connection wiring line overlap the first transfer electrode, respectively, wherein a first end of the first connection wiring line is connected to the gate electrode of the second noise reduction transistor, and a second end of the first connection wiring line is connected to an end of the second portion of the second transfer electrode that is not in a same layer as the first connection wiring line, and wherein a first end of the second connection wiring line is connected to the gate electrode of the first noise reduction transistor, and a second end of the second connection wiring line is connected to the second clock signal line to receive the second clock signal.

7. The display substrate according to claim 6, wherein an orthographic projection of the active layer of the second noise reduction transistor and an orthographic projection of the active layer of the first noise reduction transistor on the base substrate are at a side of an orthographic projection of an active layer of the first control transistor on the base substrate close to the display region.

8. The display substrate according to claim 6, wherein the shift register unit further comprises a first insulation layer, a second insulation layer, and a third insulation layer, wherein the first insulation layer is between the active layer of the first control transistor and the gate electrode of the first control transistor, and the second insulation layer and the third insulation layer are between the first transfer transistor and the gate electrode of the first control transistor, wherein the gate electrode of the first control transistor is connected to the second portion of the first transfer electrode through a hole penetrating through the second insulation layer and the third insulation layer, and wherein the second end of the first connection wiring line is connected to the end of the second portion of the second transfer electrode through a hole penetrating through the second insulation layer and the third insulation layer.

9. The display substrate according to claim 4, further comprising a first power line configured to provide a first voltage to the shift register unit,
wherein the first power line extends along the first direction on the base substrate and is connected to the second control circuit, and
wherein an orthographic projection of the first power line on the base substrate is on a side of an orthographic projection of the shift register unit on the base substrate close to the display region.

10. The display substrate according to claim 9,
wherein the input transistor comprises a first gate electrode and a second gate electrode arranged in parallel,
wherein the first gate electrode and the second gate electrode of the input transistor are connected to a gate electrode of the second control transistor, and
wherein the gate electrode of the second control transistor is also connected to the first clock signal line, and the first clock signal line provides the first clock signal to the gate electrode of the second control transistor and the first gate electrode and the second gate electrode of the input transistor.

11. The display substrate according to claim 10, further comprising a third transfer electrode, and the third transfer electrode extending along the first direction,
wherein a first end of the third transfer electrode is connected to the gate electrode of the second control transistor and the first gate electrode and the second gate electrode of the input transistor through a hole penetrating through an insulation layer, and a second end of the third transfer electrode is connected to a second electrode of the first control transistor.

12. The display substrate according to claim 9,
wherein the shift register unit further comprises an output control circuit,
wherein the output control circuit is configured to control a level of the output terminal under control of the level of the second node,
wherein the output control circuit comprises an output control transistor and a first capacitor, and
wherein an orthographic projection of the first capacitor on the base substrate is on a side of an orthographic projection of an active layer of the output control transistor on the base substrate close to the display region, and the orthographic projection of the first capacitor on the base substrate and the orthographic projection of the first power line on the base substrate at least partially overlap.

13. The display substrate according to claim 12, further comprising a fourth transfer electrode,
wherein the fourth transfer electrode is connected to a first electrode of the second noise reduction transistor and a first electrode of the output control transistor,
wherein a gate electrode of the second noise reduction transistor is connected to a gate electrode of the output control transistor, and
wherein the fourth transfer electrode also comprises the second node.

14. The display substrate according to claim 12, further comprising a fifth transfer electrode,
wherein the output circuit comprises an output transistor and a second capacitor, an orthographic projection of the second capacitor on the base substrate is on a side of the orthographic projection of the first power line on the base substrate away from the display region, and
wherein a first electrode of the output transistor is connected to a first end of the fifth transfer electrode, and a gate electrode of the first noise reduction transistor is connected to the fifth transfer electrode through a hole penetrating through an insulation layer.

15. The display substrate according to claim 14, further comprising a sixth transfer electrode extending along the second direction,
wherein a gate electrode of the output transistor is connected to a first end of the sixth transfer electrode through a hole penetrating through the insulation layer, and a second end of the sixth transfer electrode is connected to a second electrode of the voltage stabilizing transistor, and
wherein the sixth transfer electrode comprises the third node.

16. The display substrate according to claim 14, further comprising a seventh transfer electrode,
wherein a first end of the seventh transfer electrode is connected to a second electrode of the output control transistor, and a second end of the seventh transfer electrode is connected to a second electrode of the output transistor, and
the second electrode of the output transistor is connected to a second electrode of an input transistor of a next stage of shift register unit adjacent to the shift register unit.

17. The display substrate according to claim 14,
wherein an active layer of the output control transistor and at least part of an active layer of the output transistor are in a second semiconductor layer that is continuous, and the second semiconductor layer extends along the first direction, and
wherein a gate electrode of the output control transistor and a gate electrode of the output transistor extend along the second direction and are arranged side by side in the first direction, and a first electrode of the output control transistor is connected to the first power line to receive the first voltage.

18. The display substrate according to claim 4, further comprising a second power line,
wherein the second power line extends along the first direction on the base substrate and is configured to provide a second voltage to the shift register unit,
wherein an orthographic projection of the second power line on the base substrate is between orthographic projections of the first clock signal line as well the second clock signal line on the base substrate and an orthographic projections of the shift register unit on the base substrate, and
wherein a gate electrode of the voltage stabilizing transistor is connected to the second power line to receive the second voltage,
wherein the second power line comprises a protrusion portion protruding in the second direction, and
wherein a second electrode of the second control transistor is connected to the protrusion portion on the second power line to receive the second voltage.

19. The display substrate according to claim 1,
wherein an orthographic projection of an active layer of the voltage stabilizing transistor on the base substrate is on a side of an orthographic projection of an active layer of the first control transistor on the base substrate away from the display region.

20. The display substrate according to claim 1, wherein the first clock signal line and the second clock signal line are on a side of the shift register unit away from the display region.

* * * * *